United States Patent
Suzuki

(10) Patent No.: US 6,734,086 B2
(45) Date of Patent: May 11, 2004

(54) SEMICONDUCTOR INTEGRATED CIRCUIT DEVICE AND METHOD OF MANUFACTURING THE SAME

(75) Inventor: Masayuki Suzuki, Kokubunji (JP)

(73) Assignee: Renesas Technology Corp., Tokyo (JP)

( * ) Notice: Subject to any disclaimer, the term of this patent is extended or adjusted under 35 U.S.C. 154(b) by 15 days.

(21) Appl. No.: 10/208,780

(22) Filed: Aug. 1, 2002

(65) Prior Publication Data

US 2003/0032234 A1 Feb. 13, 2003

(30) Foreign Application Priority Data

Aug. 9, 2001 (JP) ........................................ 2001-241792

(51) Int. Cl.[7] .............................................. H01L 21/44
(52) U.S. Cl. ........................ 438/575; 438/570; 438/573; 438/580; 438/171; 438/190; 438/239
(58) Field of Search ................................ 438/570–582, 438/210, 190, 171, 238–248

(56) References Cited

U.S. PATENT DOCUMENTS

| | | | | |
|---|---|---|---|---|
| 5,130,080 A | * | 7/1992 | Niedrach | 376/305 |
| 5,874,364 A | * | 2/1999 | Nakabayashi et al. | 438/738 |
| 6,074,945 A | * | 6/2000 | Vaartstra et al. | 438/681 |
| 6,225,237 B1 | * | 5/2001 | Vaartstra | 438/778 |
| 6,281,125 B1 | * | 8/2001 | Vaartstra et al. | 438/681 |
| 6,303,809 B1 | * | 10/2001 | Chi et al. | 556/136 |
| 6,352,580 B1 | * | 3/2002 | Uhlenbrock et al. | 106/1.05 |
| 6,452,017 B1 | * | 9/2002 | Uhlenbrock et al. | 548/101 |
| 2001/0007793 A1 | * | 7/2001 | Vaartstra | 438/686 |
| 2001/0031403 A1 | * | 10/2001 | Giron | 429/304 |
| 2002/0102826 A1 | * | 8/2002 | Shimamoto et al. | 438/575 |
| 2002/0146902 A1 | * | 10/2002 | Vaartstra | 438/650 |
| 2002/0181644 A1 | * | 12/2002 | Hettiarachchi et al. | 376/306 |
| 2003/0003722 A1 | * | 1/2003 | Vaartstra | 438/656 |

FOREIGN PATENT DOCUMENTS

JP          9-246214          9/1997

* cited by examiner

Primary Examiner—Renzo Rocchegiani
(74) Attorney, Agent, or Firm—Antonelli, Terry, Stout & Kraus, LLP

(57) ABSTRACT

A WN film serving as an adhesive layer is deposited over the sidewalls and bottom surface of a hole in a silicon oxide film where an information storage capacitor is to be formed. A Ru film to serve as a lower electrode for the information storage capacitor is formed above the WN film by CVD using $Ru(HFAC)_3$, $H_2O$ and $H_2$ as ingredients, so that a ratio of partial pressure of $H_2O$ to $H_2$ is controlled to be in the area below a curve (a). When the Ru film is formed by CVD utilizing hydrolysis, the film quality of the Ru film can be enhanced. The ratio of partial pressure of $H_2O$ to $H_2$ is controlled, whereby oxidation of the Ru film can be suppressed. When it is controlled to be in the area below a curve (b) to form the Ru film, oxidation of the WN film can be suppressed.

13 Claims, 36 Drawing Sheets

2Cu(HFA) (TMVS) $\xrightarrow{H_2O}$ Cu + Cu(HFA)$_2$ + 2TMVS

SEMICONDUCTOR INTEGRATED CIRCUIT DEVICE AND METHOD OF MANUFACTURING THE SAME

BACKGROUND OF THE INVENTION

The present invention relates to a semiconductor integrated circuit device and to a method of manufacturing the same; and, more particularly, the invention relates to an effective technique that may be applied to a method of depositing metal films or metal oxides using Chemical Vapor Deposition (CVD).

Semiconductor devices, or interconnect lines configuring a semiconductor integrated circuit device, are formed by repeating the formation of conductive films and insulating films and the photolithography and patterning of each film. One of the methods of forming these films is a CVD process that uses chemical reactions.

For example, a DRAM (Dynamic Random Access Memory) has memory cell selecting MISFETs and an information storage capacitor directly connected to the memory cell selecting MISFETs. In each memory cell, an information storage capacitor is formed by sequentially depositing a conductive layer which is to serve as a lower electrode, a capacitor dielectric layer, and a conductive layer which is to serve as an upper electrode. A study has been conducted for the use a metal film, such as Ru (ruthenium), for the lower electrode.

Such a metal film or capacitor dielectric can also be formed by CVD. For instance, Japanese Patent Laid-Open No. 246214/1997 discloses a method of forming a Ru film by CVD using Ru(DMHPD)$_3$: 2,6-dimethyl 3,5-heptadione Ruthenium, as an ingredient.

Additionally, Japanese Patent Laid-Open No. 86270/1995 describes a technique for forming SrTiO$_3$, to be used as a capacitor dielectric, by CVD using an organic metal as an ingredient.

SUMMARY OF THE INVENTION

The inventor has conducted research on and development of the DRAM and has been studying a variety of configurations and methods of forming the information storage capacitor.

With the miniaturization of semiconductor integrated circuit devices, the area available for forming the information storage capacitor also tends to be reduced, and so it has become difficult to secure a desired capacity. Thus, studies on materials to be used for electrodes or a capacitor dielectric material are needed in order to obtain a high capacity within a small area.

Thus, the present inventor has considered a Ru film for use as the lower electrode of the information storage capacitor and has been doing various studies on methods of forming this lower electrode. Platinum metals, such as Ru, do not generate a low dielectric constant film, like an oxynitride film, even in annealing after it is formed. Additionally, it can be formed thinly because it is a metal, and so it is considered preferable to increase the capacity.

To form the Ru film, for example, a forming method using CVD has been considered, which uses a tetrahydrofuran solution of ethoxycycldpentadienylruthenium (Ru(C$_2$H$_5$OC$_5$H$_4$)$_2$) and O$_2$ (oxygen) as ingredients. However, the deposition utilizing such a reaction of the organic compound (ethoxycyclopentadienylruthenium) and oxygen leaves organic compounds or compounds thereof and oxygen in the Ru film, thereby to degrade the film quality of the Ru film.

Furthermore, a problem arises in that a metal layer formed under the Ru film is oxidized when high temperature annealing is performed, after forming the Ru film, in order to remove the organic compounds in the Ru film. For example, the platinum metals, such as Ru, generally have poor adhesion to insulating films like silicon oxide. Thus, a metal layer, which is to serve as an adhesive layer, is typically formed between these films to prevent peeling. However, this metal layer reacts with oxygen in the Ru film, causing it to be oxidized in the annealing described above. Consequently, a problem arises in that a conducting failure is generated between the information storage capacitor (lower electrode) and the memory cell selecting MISFETs.

It is an object of the present invention to provide a technique for enhancing the film quality of a metal film formed by CVD, such as a Ru film, which forms the lower electrode of an information storage capacitor.

Another object of the present invention is to form an excellent metal film to improve the characteristics of a semiconductor integrated circuit device in which the metal film is provided.

The aforesaid and other objects and novel features of the present invention will be apparent from the following description provided in the specification and the accompanying drawings.

Among the features and aspects of the present invention disclosed in this application, representative ones are as follows:

1. A method of manufacturing a semiconductor integrated circuit device according to the present invention has a step of forming a metal film over a semiconductor substrate, such as a Ru film configuring a lower electrode of a capacitor, by CVD using a compound of metal forming the metal film, H$_2$O and a reducing agent, such as H$_2$.

2. A method of manufacturing a semiconductor integrated circuit device according to the present invention has a step of forming a metal film over a semiconductor substrate, such as a Ru film configuring a lower electrode of a capacitor, or a Cu film configuring interconnect lines, by CVD using a compound of metal forming the metal film, H$_2$O and a reducing agent, such as H$_2$, at a predetermined temperature. Additionally, when using H$_2$, the method has the step of forming the metal film under a condition such that a ratio of partial pressure of the H$_2$O to the H$_2$ ([H$_2$O]/[H$_2$]) becomes smaller than a ratio of H$_2$O to H$_2$ ([H$_2$O]eq/[H$_2$]eq) when a system 1 (an oxide of metal forming the metal film+H$_2$) and a system 2 (a metal forming the metal film+H$_2$O) are in equilibrium at the predetermined temperature.

3. A method of manufacturing a semiconductor integrated circuit device according to the present invention has a step of forming a metal oxide film over a semiconductor substrate, such as a tantalum oxide film, to serve as a capacitor dielectric element of a capacitor, by CVD using a compound of metal forming the metal oxide film, H$_2$O and a reducing agent, such as H$_2$, at a predetermined temperature. Furthermore, when using H$_2$, the method has the step of forming the metal oxide film under a condition such that a ratio of partial pressure of the H$_2$O to the H$_2$ ([H$_2$O]/[H$_2$]) becomes greater than a ratio of H$_2$O to H$_2$ ([H$_2$O]eq/[$_2$]eq) when a system 1 (an oxide of metal forming the metal oxide film+H$_2$) and a system 2 (a metal forming the metal oxide film+H$_2$O) are in equilibrium at the predetermined temperature.

4. A method of manufacturing a semiconductor integrated circuit device according to the present invention involves provision of a second metal film (Ru film or Cu film) over a first metal film or first metal nitride film overlaying a semiconductor substrate, such as a W film or WN film, to serve as an adhesive layer or barrier layer, and the method has a step of forming the second metal film by CVD using a compound of metal forming the second metal film, $H_2O$ and a reducing agent, such as $H_2$, at a predetermined temperature. Moreover, when using $H_2$, there is a step of forming the second metal film under a condition that a ratio of partial pressure of the $H_2O$ to the $H_2$ ($[H_2O]/[H_2]$) becomes smaller than a ratio of $H_2O$ to $H_2$ ($[H_2O]eq/[H_2]eq$) when a system 1 (an oxide of metal forming the first metal film or first metal nitride film+$H_2$) and a system 2 (a metal forming the first metal film or first metal nitride film+$H_2O$) are in equilibrium at the predetermined temperature.

5. A method of manufacturing a semiconductor integrated circuit device in accordance with the present invention involves the provision of a second metal oxide film (a tantalum oxide film to be a capacitor dielectric) over a first metal film or first metal nitride film overlaying a semiconductor substrate, such as a W film or WN film, serving as a barrier layer or a Ru film configuring a lower electrode for the capacitor, and the method has a step of forming the second oxide film by CVD using a compound of metal forming the second metal oxide film, $H_2O$ and $H_2$ at a predetermined temperature. Additionally, when using $H_2$, the second metal oxide film is formed under a condition such that a ratio of partial pressure of the $H_2O$ to the $H_2([H_2O]/[H_2])$ becomes greater than a ratio of partial pressure of $H_2O$ to $H_2$ ($[H_2O]eq1/[H_2]eq1$) when a system 1 (an oxide of metal forming the second metal oxide film+$H_2$) and a system 2 (a metal forming the second metal oxide film+$H_2O$) are in equilibrium at the predetermined temperature and becomes smaller than a ratio of partial pressure of $H_2O$ to $H_2$ ($[H_2O]eq2/[H_2]eq2$) when a system 3 (an oxide of metal forming the first metal film or first metal nitride film+$H_2$) and a system 4 (a metal forming the first metal film or first metal nitride film+$H_2O$) are in equilibrium at the predetermined temperature.

BRIEF DESCRIPTION OF THE DRAWINGS

The teachings of the invention can be readily understood by considering the following detailed description in conjunction with the accompanying drawings, in which.

DETAILED DESCRIPTION OF THE INVENTION

Hereafter, various embodiments of the present invention will be described in more detail with reference to the drawings. Additionally, in all the drawings, members having the same functions are designated by the same numerals and signs, and an overlapping description thereof will be omitted.

Embodiment 1

A method of manufacturing a DRAM according to this embodiment will be described in the order of the steps thereof, with reference to FIGS. 1 to 17.

Figure 1:
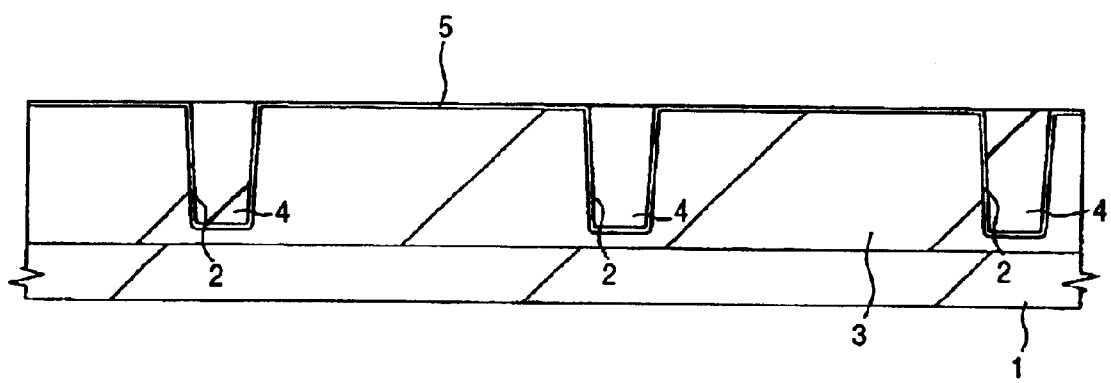
FIG. 1 is a section view of a semiconductor substrate illustrating a the step in method of manufacturing a semiconductor integrated circuit device representing an embodiment 1 of the invention.
Figure 2:
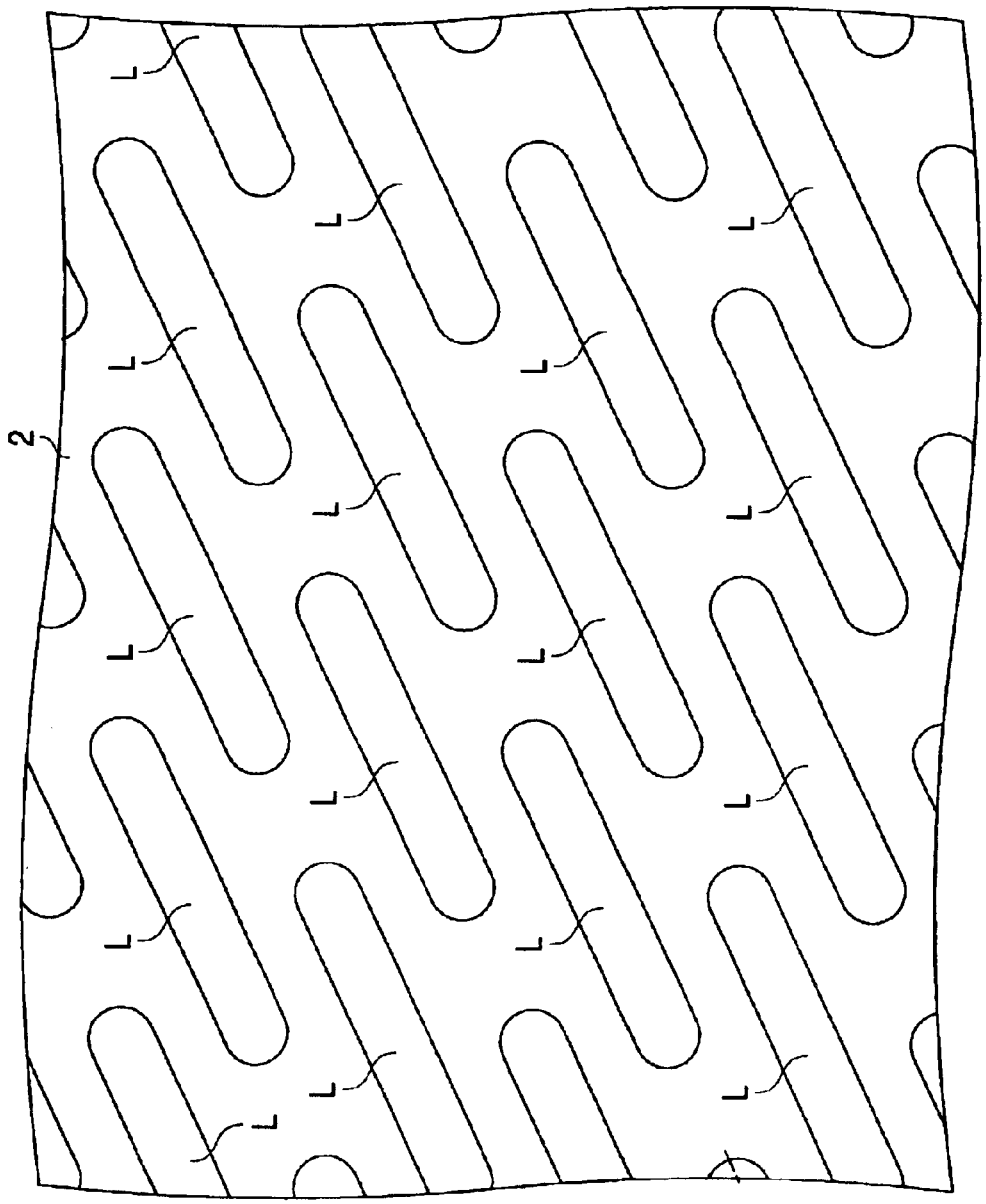
FIG. 2 is a plan view of the semiconductor substrate illustrating a step in the method of manufacturing the semiconductor integrated circuit device representing the embodiment 1 of the invention.

First, as shown in FIG. 1, a device isolation 2 is formed across the device isolation area on the front surface of a semiconductor substrate 1, that is comprised of p-type monocrystal silicon, for example. In addition, the device isolation 2 is formed such that narrow, island-shaped active regions (L) surrounded by the device isolation 2 are formed simultaneously, as shown in FIG. 2. Each of the active regions (L) is formed with two memory cell selecting MISFETs Qs sharing either source or drain.

To form the device isolation 2, the surface of the semiconductor substrate 1 is etched to form a trench having a depth of about 300 to 400 nm, and a thin silicon oxide film is formed inside the trench. Subsequently, a silicon oxide film 4 (with a film thickness of about 600 nm) is deposited above the semiconductor substrate 1, including the inside of the trench, and then the silicon oxide film 4 is polished back by CMP (Chemical Mechanical Polishing).

After that, B (boron) is ion-implanted into the semiconductor substrate 1 to form a p-well 3, the surface of the p-well 3 is rinsed with HF (hydrofluoric acid) based cleaning liquid, and then the semiconductor substrate 1 is thermally oxidized, whereby the surface of the swell 3 (active region L) is formed with a gate dielectric 5, having a film thickness of about 6 nm.

Figure 3:
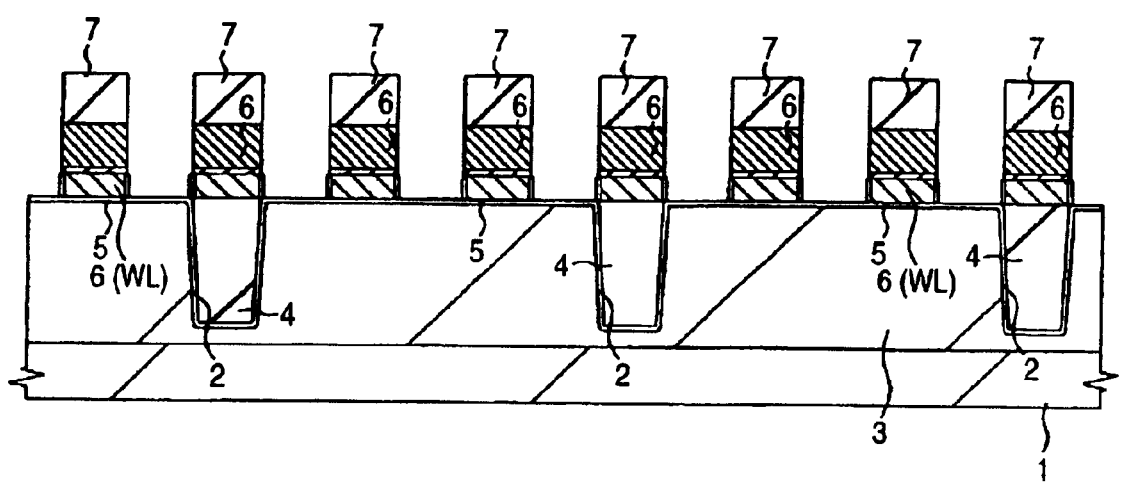
FIG. 3 is a section view of the semiconductor substrate illustrating a step in the method of manufacturing the semiconductor integrated circuit device representing the embodiment 1 of the invention.

Subsequently, as shown in FIG. 3, a gate electrode 6 is formed above the gate dielectric 5. The gate electrode 6 is formed by a process in which a n-type polycrystalline silicon film (a film thickness of about 70 nm) doped with P (phosphorus), a barrier metal film (a film thickness of about 5 to 10 nm) comprised of WN (tungsten nitride) or TiN (titanium nitride), a W film (tungsten film having a film thickness of about 100 nm) and a silicon nitride film 7 (a film thickness of about 150 nm) are sequentially deposited above the gate dielectric 5, for example, and then a photoresist film (not shown) is used as a mask to dry-etch these films the polycrystalline silicon film and the silicon nitride film 7 are deposited by CVD, and the barrier metal film and the W film are deposited by sputtering. The gate electrode 6 functions as a word line (WL). Then, wet hydrogen oxidation is performed, and a thin silicon oxide film is formed on the sidewalls of the n-type polycrystalline silicon film configuring the gate electrode 6. This wet hydrogen oxidation can selectively form an oxide film only on silicon.

Figure 4:
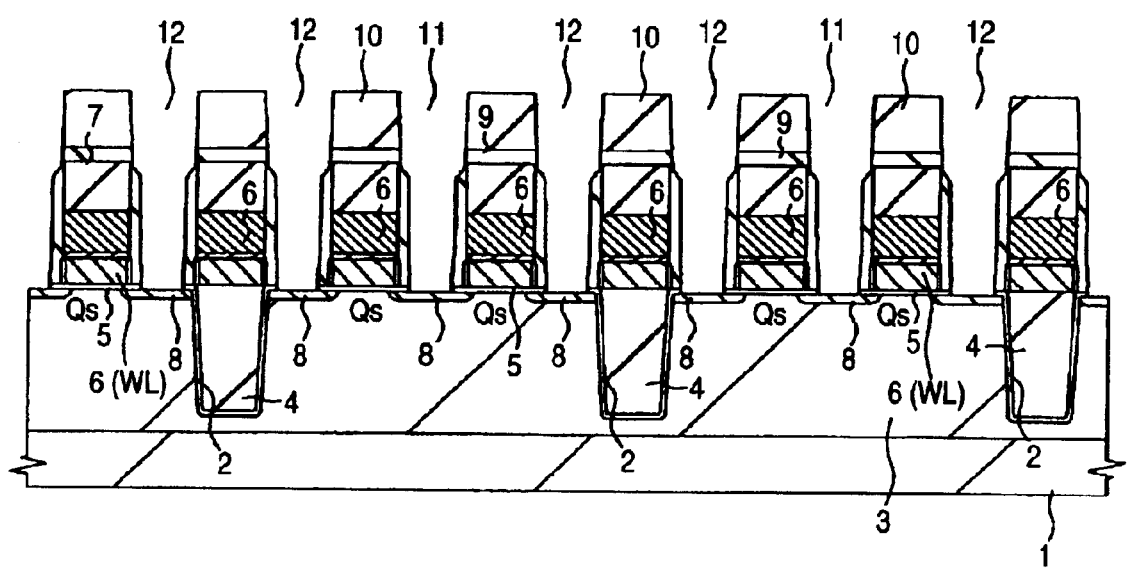
FIG. 4 is a section view of the semiconductor substrate illustrating a step in the method of manufacturing the semiconductor integrated circuit device representing the embodiment 1 of the invention.

After that, as shown in FIG. 4, As (arsenic) or P (phosphorous) is ion-implanted into the swell 3 to form n-type semiconductor regions 8 (source/drain) on both sides of the gate electrode 6. By the steps described so far, the memory cell selecting MISFETs Qs are almost completed.

Next, a silicon nitride film 9 (a film thickness of 50 nm) and a silicon oxide film 10 (a film thickness of about 600 nm) are deposited above the semiconductor substrate 1 by CVD, the surface of the silicon oxide film 10 is planarized by CMP, and then a photoresist film (not shown) is used as a mask to dry-etch the silicon oxide film 10 and the silicon nitride film 9, whereby contact holes 11 and 12 are formed above the n-type semiconductor regions 8 (source/drain) of the memory cell selecting MISFETs Qs. The silicon oxide film 10 is etched under a condition of a greater selection ratio to the silicon nitride film, and the silicon nitride film 9 is etched under a condition of a greater selection ratio to silicon or the silicon oxide film. Accordingly, the contact holes 11 and 12 are formed in self-alignment to the gate electrodes 6 (word lines).

Figure 5:
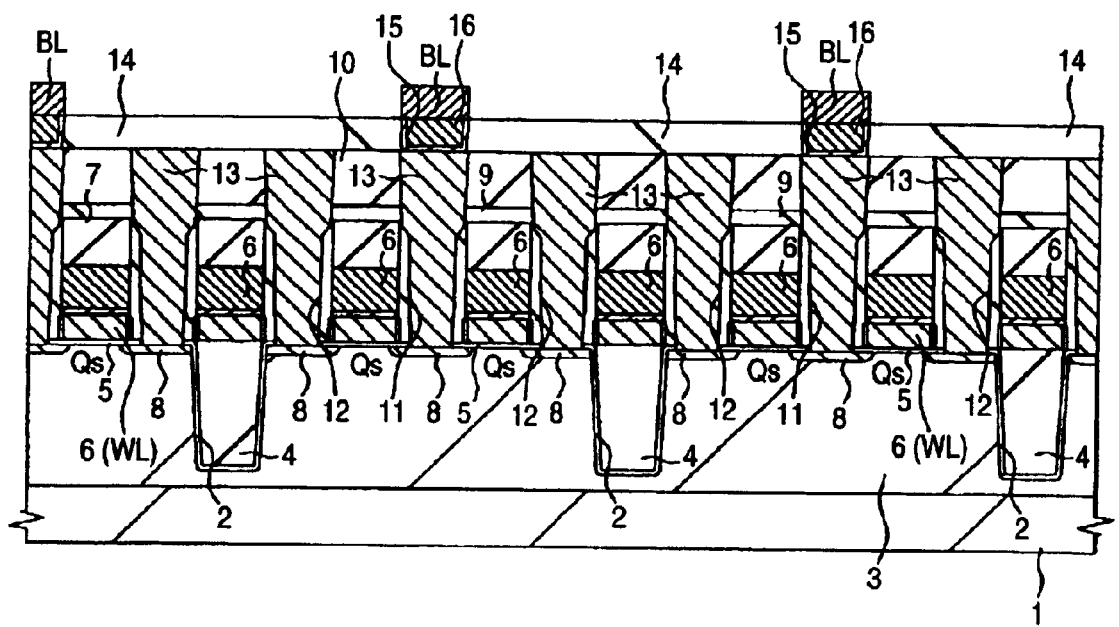
FIG. 5 is a section view of the semiconductor substrate illustrating a step in the method of manufacturing the semiconductor integrated circuit device representing the embodiment 1 of the invention.

Subsequently, as shown in FIG. 5, a plug 13 is formed inside the contact holes 11 and 12. To form the plug 13, an n-type polycrystalline silicon film doped with P is deposited above the silicon oxide film 10 by CVD to bury the n-type polycrystalline silicon film inside the contact holes 11 and 12, and then the n-type polycrystalline silicon film outside the contact holes 11 and 12 is removed by CMP (or etch back).

After that, a silicon oxide film 14 (a film thickness of about 150 nm) is deposited above the silicon oxide film 10 by CVD, and then a photoresist film (not shown) is used as a mask to dry-etch the silicon oxide film 14 above the contact hole 11, whereby a through hole 15 is formed.

Subsequently, a plug 16 is formed inside the through hole 15. To form the plug 16, a barrier metal film, that is comprised of a laminated film of a Ti film and a TiN film, is deposited above the silicon oxide film 14 by sputtering, for example; a W film is deposited above the barrier metal film by CVD so as to bury these films inside the through hole 15; and then, these films outside the through hole 15 are removed by CMP. Through these plugs 16 and 13, n-type semiconductor regions 8 (source/drain) of the memory cell selecting MISFETs Qs are connected to a bit line BL, to be described later.

After that, the bit line BL is formed on the silicon oxide film 14 and the plug 16. To form the bit line BL, for example, a TiN film (a film thickness of about 10 nm, not shown) is deposited above the silicon oxide film 14 by sputtering; a W film (a film thickness of about 50 nm) is deposited above the TiN film by CVD; and then, a photoresist film (not shown) is used as a mask to dry-etch these films.

Figure 6:
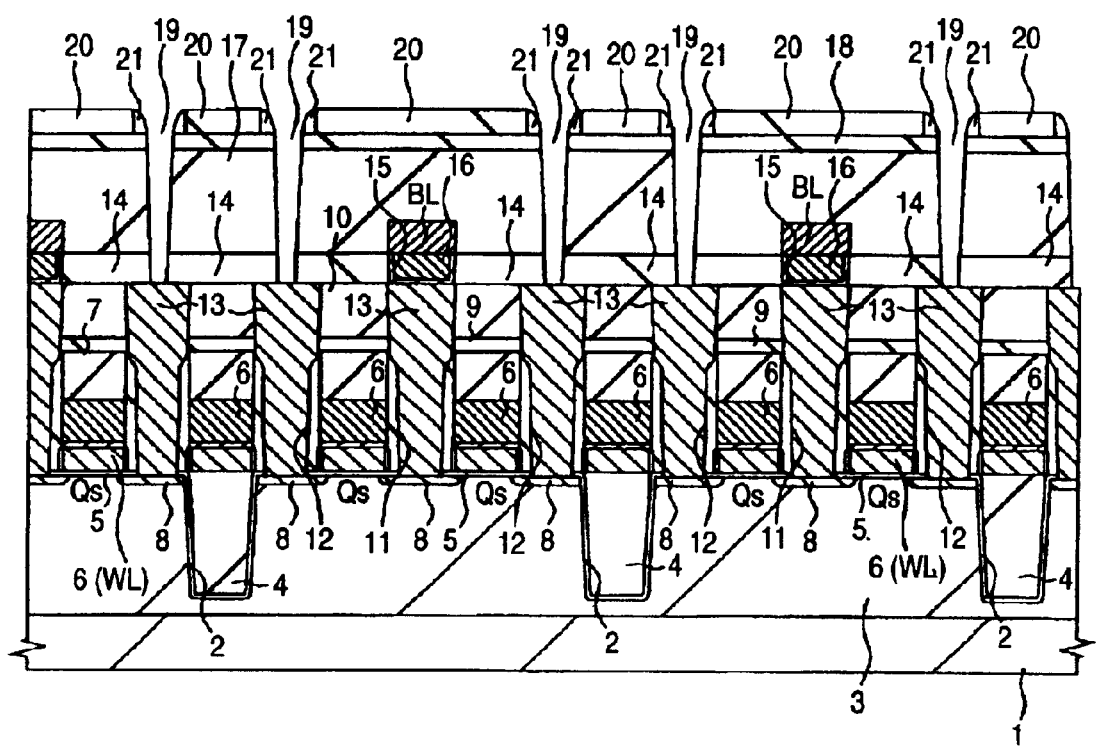
FIG. 6 is a section view of the semiconductor substrate illustrating a step in the method of manufacturing the semiconductor integrated circuit device representing the embodiment 1 of the invention.

Then, as shown in FIG. 6, a silicon oxide film 17 (a film thickness of about 300 nm) is deposited above the bit line BL by CVD, and then the surface is planarized by CMP. Subsequently, a silicon nitride film 18 (a film thickness of about 50 nm) is deposited above the silicon oxide film 17 by CVD.

After that, the silicon nitride film 18 and the silicon oxide film 17 are dry-etched, whereby a through hole 19 is formed above the contact hole 12 buried with the plug 13.

The through hole 19 is formed so as to have a diameter smaller than that of the contact hole 12 thereunder. In this case, the diameter is about 0.1 $\mu$m. More specifically, a polycrystalline silicon film 20 is deposited above the silicon nitride film 18 by CVD, the polycrystalline silicon film 20, where the through hole 19 is formed, is dry-etched to form a hole (the diameter is about 0.18 $\mu$m), and then a polycrystalline silicon film (not shown) is further deposited above the polycrystalline silicon film 20. Subsequently, the polycrystalline silicon film disposed above the polycrystalline silicon film 20 is anisotropically etched to form a sidewall spacer 21 on the sidewalls of the hole, and then the polycrystalline silicon film 20 and the sidewall spacer 21 are used as a hard mask to dry-etch the silicon nitride film 18 and the silicon oxide films 17 and 14 on the bottom surface of the hole.

Figure 7:
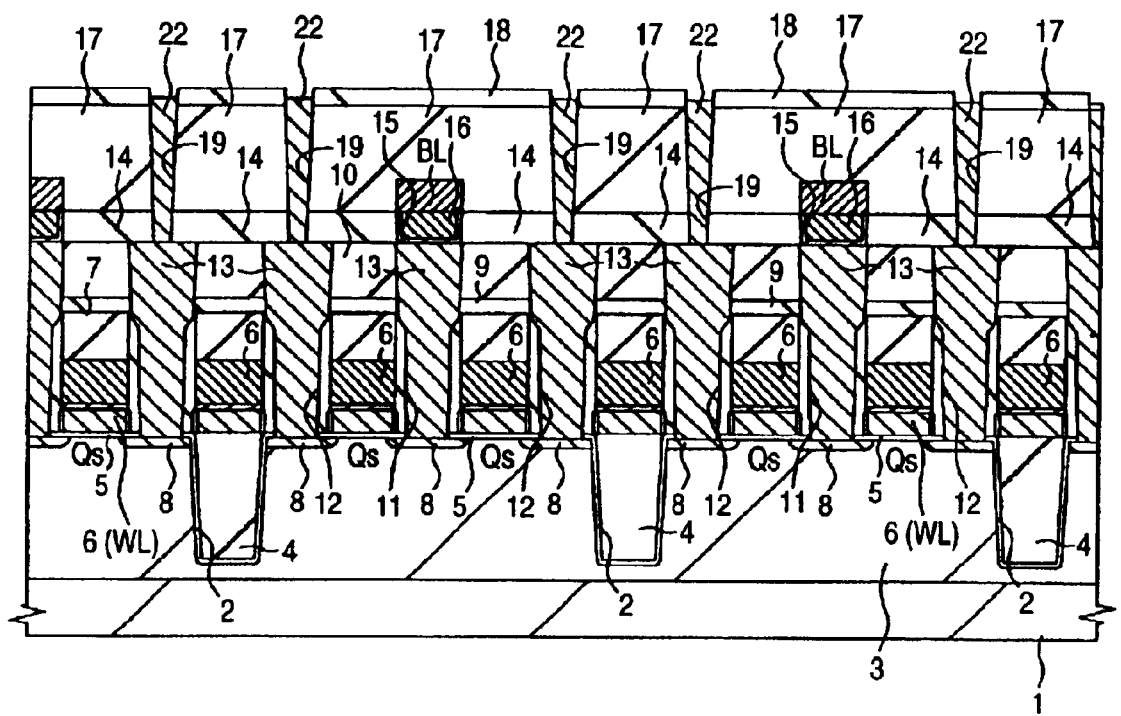
FIG. 7 is a section view of the semiconductor substrate illustrating a step in the method of manufacturing the semiconductor integrated circuit device representing the embodiment 1 of the invention.

After that, the polycrystalline silicon film 20 and the sidewall spacer 21 are removed by dry etching, and then a plug 22 is formed inside the through,hole 19, as shown in FIG. 7. To form the plug 22, an n-type polycrystalline silicon film doped-with P is first deposited above the silicon nitride film 18 by CVD to bury the n-type polycrystalline silicon film inside the through hole 19, and then the n-type polycrystalline silicon film outside the through hole 19 is removed by CMP (or etch back). At this time, the polycrystalline silicon film is over polished (or over etched), whereby the height of the surface of the plug 22 is recessed below the top of the through hole 19.

Figure 8:
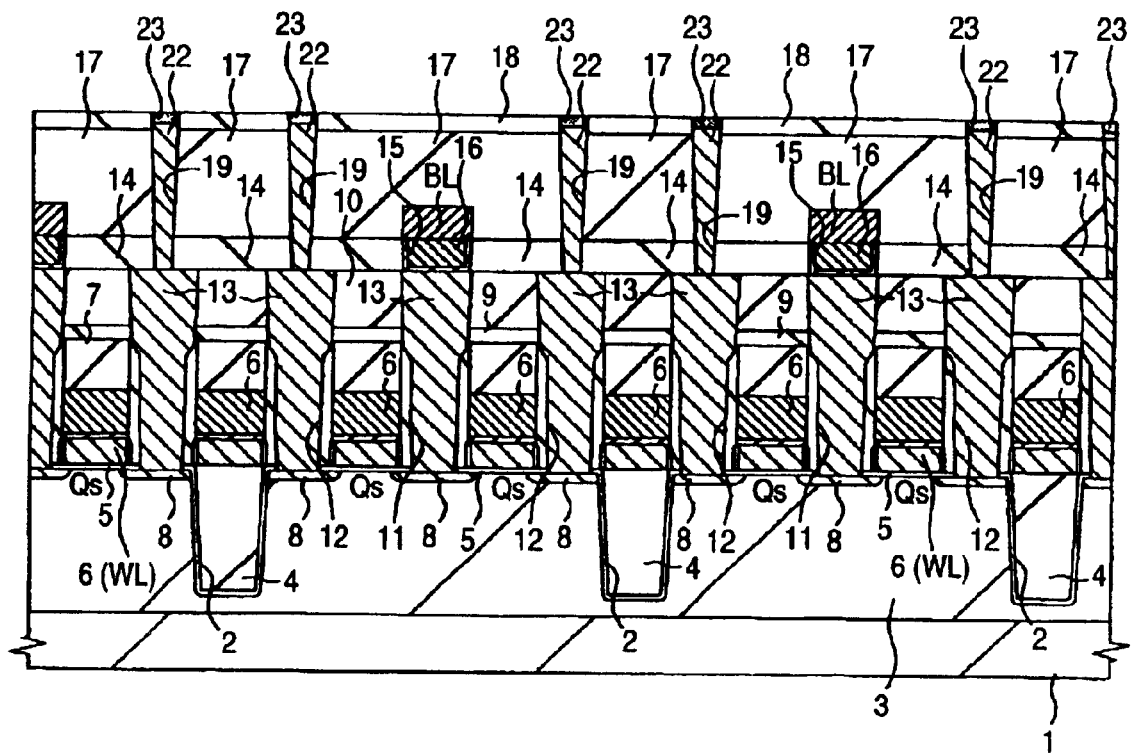
FIG. 8 is a section view of the semiconductor substrate illustrating a step in the method of manufacturing the semiconductor integrated circuit device representing the embodiment 1 of the invention.

Then, as shown in FIG. 8, a barrier layer 23 is formed above the plug 22. To form the barrier layer 23, a WN film is deposited above the silicon nitride film 18 by sputtering and then the WN film outside the through hole 19 is removed by CMP (or dry etching). The barrier layer 23 is formed in order to prevent an undesirable silicide reaction from occurring, in which Ru (ruthenium), which forms an under electrode 30A, reacts with the polycrystalline silicon of the plug 22 to form suicides during the annealing to be performed in the course of manufacturing processes to be described later. Additionally, the barrier layer 23 may be formed of a W film or TaN film (tantalum nitride).

After that, an information storage capacitor C is formed, which is comprised of the lower electrode 30A formed of Ru film 30, a capacitor dielectric formed of a tantalum oxide film 32, and an upper electrode 33 formed of a W film and a Ru film.

The steps employed in the forming of the information storage capacitor C will be described in detail with reference to FIGS. 9 to 17. These drawings schematically depict an area where the information storage capacitor C is to be formed above the plug 22.

Figure 9:
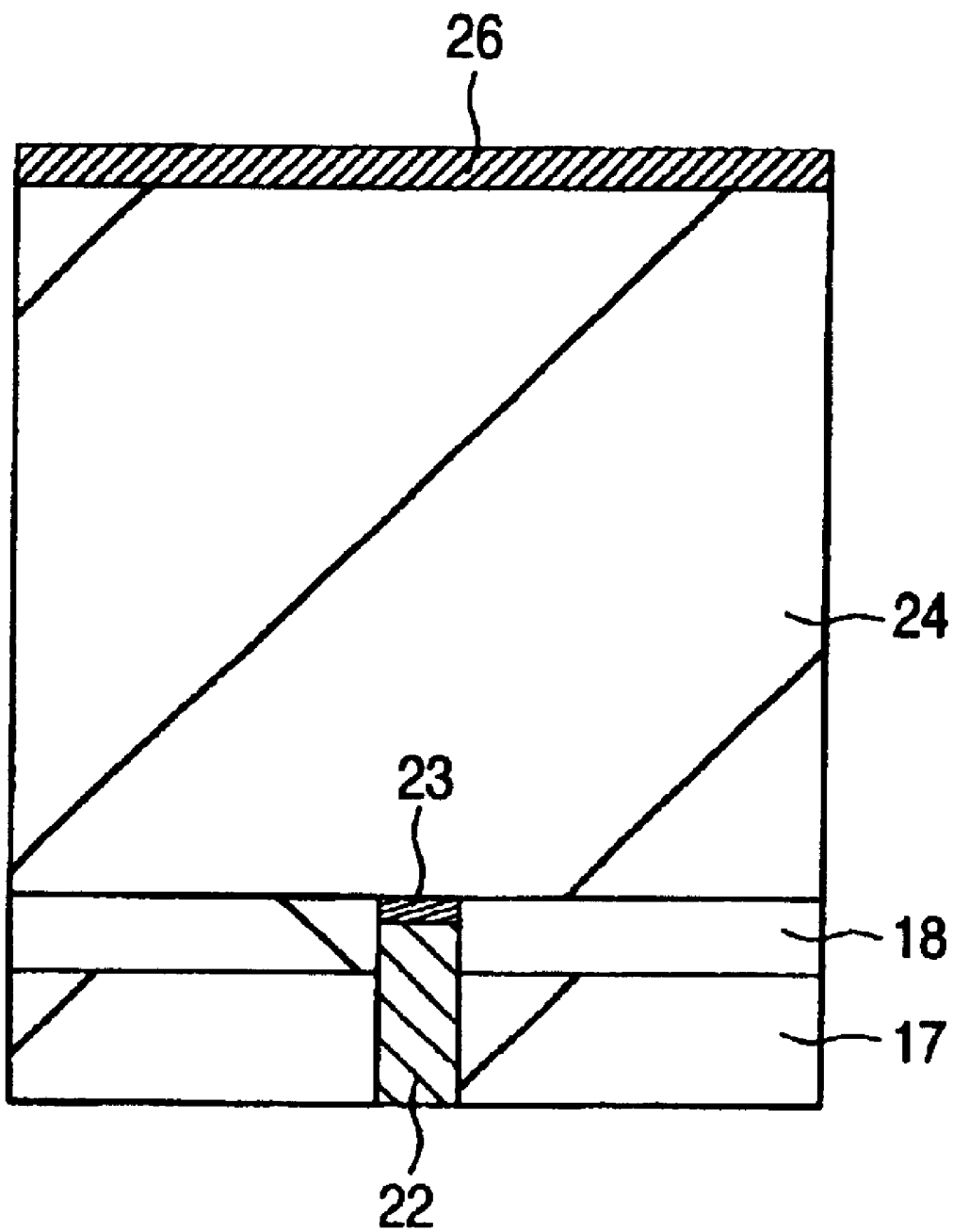
FIG. 9 is a section view of the semiconductor substrate illustrating a step in the method of manufacturing the semiconductor integrated circuit device representing the embodiment 1 of the invention.

As shown in FIG. 9, a silicon oxide film 24 is deposited over the barrier layer 23 and the silicon nitride film 18. The lower electrode of the information storage capacitor C is formed inside a hole (recessed part) that is formed in the silicon oxide film 24. In order to increase the surface area of the lower electrode so as to raise the amount of charge being stored, the silicon oxide film 24 needs to be deposited as a thick film (about 0.8 $\mu$m). The silicon oxide film 24 is deposited by plasma CVD using oxygen and tetraethoxysilane (TEOS) as source gases, for example, and then the surface thereof is planarized by CMP as necessary.

Subsequently, a W film having a film thickness of about 200 nm is deposited above the silicon oxide film 24 by sputtering, and then an anti-reflection coating is applied over the W film, whereby a hard mask 26 is formed. The hard mask 26 (W film) has a greater etching selection ratio to the silicon oxide film 24 as compared with a photoresist film, thus it is used as a mask in etching the silicon oxide film 24, which is a thick film.

Figure 10:
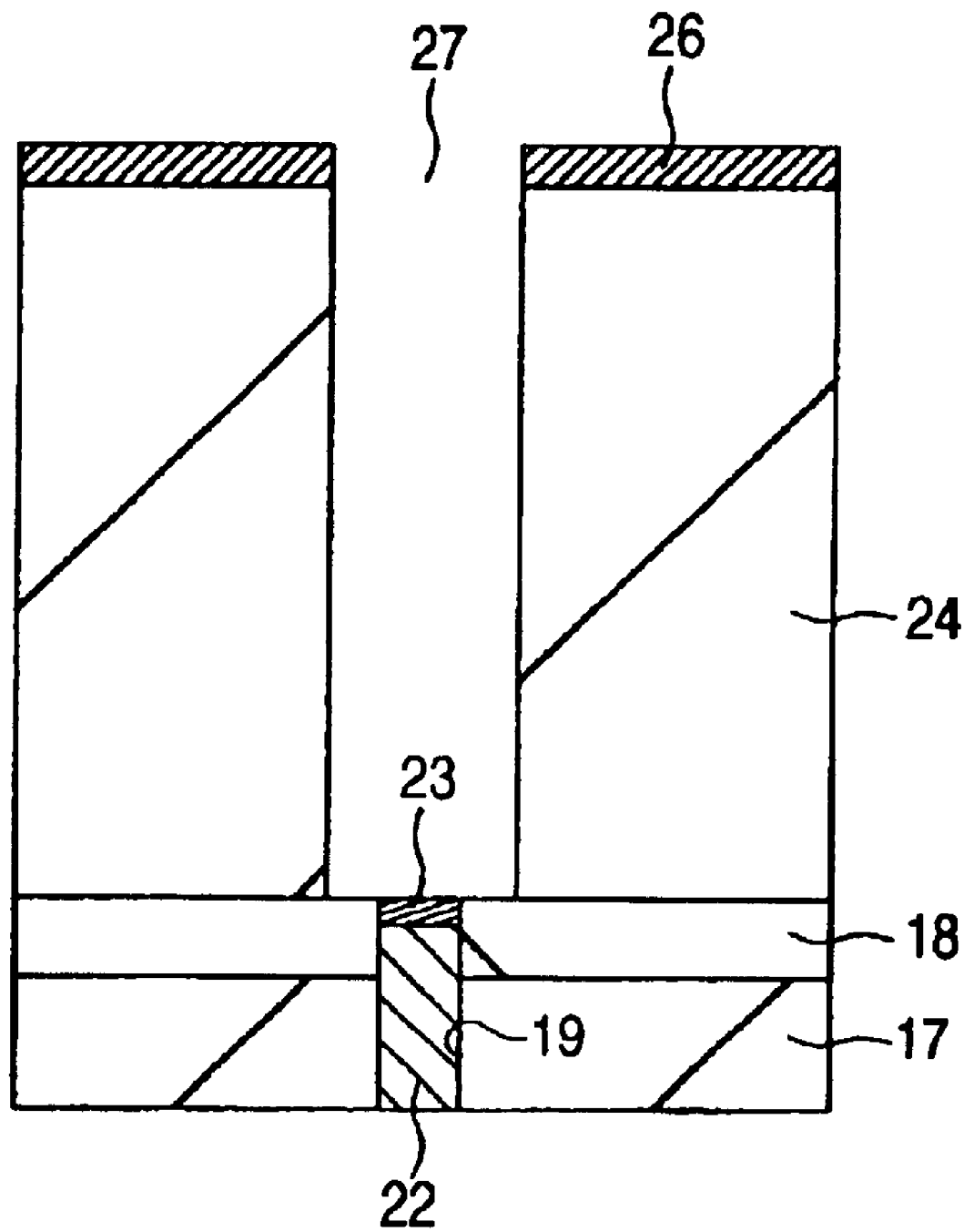
FIG. 10 is a section view of the semiconductor substrate illustrating a step in the method of manufacturing the semiconductor integrated circuit device representing the embodiment 1 of the invention.

Then, as shown in FIG. 10, a photoresist film (not shown) is formed over the hard mask 26, and the photoresist film is used as a mask to dry-etch the hard mask 26. Subsequently, the hard mask 26 is used as a mask to dry-etch the silicon oxide film 24, whereby a deep hole (recessed part) 27 is formed. In the bottom surface of the deep hole (recessed part) 27, the surface of the barrier layer 23 inside the through hole 19 is exposed.

Figure 11:
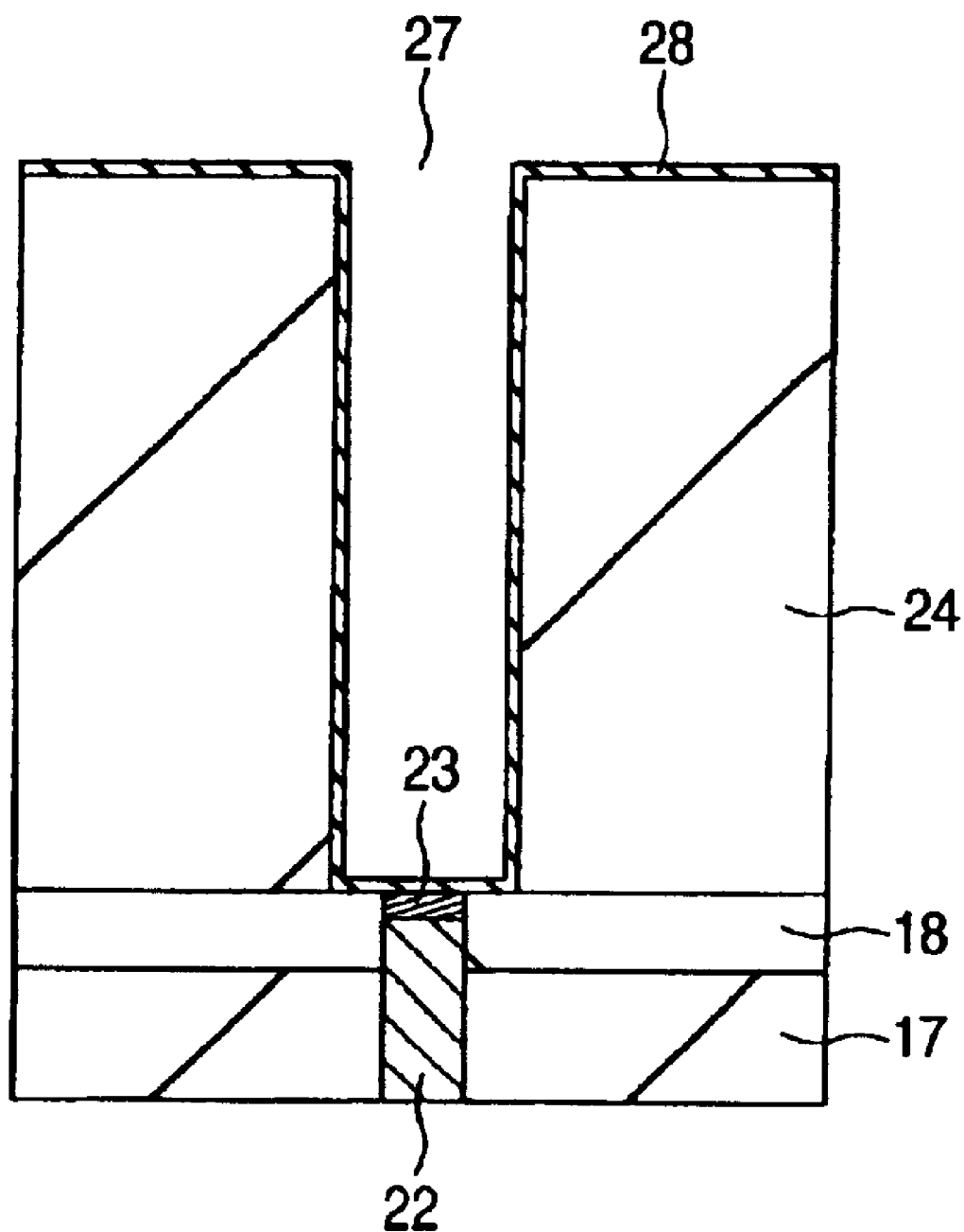
FIG. 11 is a section view of the semiconductor substrate illustrating a step in the method of manufacturing the semiconductor integrated circuit device representing the embodiment 1 of the invention.

After that, the hard mask 26, that remains above the silicon oxide film 24, is removed using a solution containing hydrogen peroxide solution, and then a WN film 29 (a film thickness of about 15 nm) is deposited above the silicon oxide film 24 and inside the hole 27 by sputtering, as shown in FIG. 11. This WN film 29 has an excellent adhesion to the silicon oxide film 24 to serve as an underlayer or to the Ru film 30 to be described later, and thus it is used as an adhesive layer. Furthermore, this WN film 29 becomes a seed for crystal growth in forming the Ru film 30 to be described later, and it allows the Ru film 30 to have an excellent deposition property.

Figure 12:
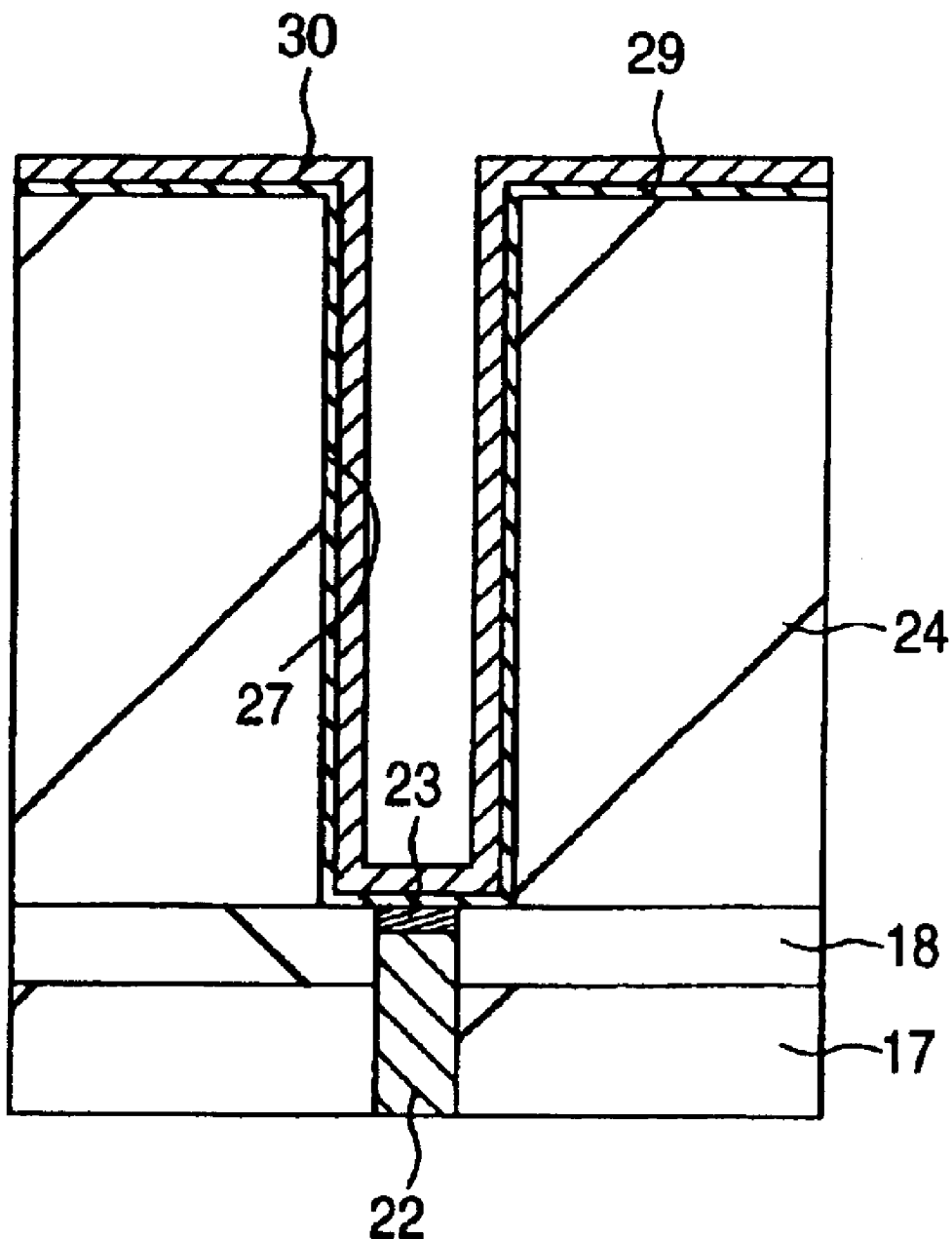
FIG. 12 is a section view of the semiconductor substrate illustrating a step in the method of manufacturing the semiconductor integrated circuit device representing the embodiment 1 of the invention.

Next, as shown in FIG. 12, the Ru film 30 (a film thickness of about 30 nm) is to be deposited above the WN film 29 by CVD. However, a Ru film having a film thickness of about 15 nm (not shown) is formed by sputtering before depositing the Ru film by CVD. This is because the film formed by sputtering becomes a seed to efficiently grow the Ru film 30 by CVD.

The Ru film 30 is formed by using Ru(HFAC)$_3$ that is an acetylacetone derivative compound of Ru, H$_2$O (water vapor) and H$_2$ (hydrogen) as ingredients. Additionally, HFAC means (CF$_3$COCHCOCF$_3$). A compound bonded with a C(CH$_3$)$_3$ group may be used instead of this CF$_3$ group. Furthermore, Ru(HFAC)(1,5-cyclooctadiene) may be used.

This organic compound solution of $Ru(HFAC)_3$ is vaporized so as to react with $H_2O$ and $H_2$ for deposition. Moreover, as an organic compound solution, a tetrahydrofuran solution and the like is proposed. Here, a reaction is generated while the ratio of partial pressure of $H_2O$ to $H_2$ is controlled so as to be in the shaded area below the curve (a) shown in FIG. 13.

First, the reaction mechanism of depositing the Ru film will be described. As for this reaction mechanism, a mechanism shown in FIGS. 14(a) and 14(b) can be considered. First, $Ru(HFAC)_3$ reacts with $H_2O$ (it is decomposed by $H_2O$) to become a $Ru(OH)_3$ hydroxide (FIG. 14(a)). Then, this $Ru(OH)_3$ hydroxide is reduced by hydrogen to generate Ru (FIG. 14(b)). As apparent from this reaction mechanism, $H_2O$ is not consumed and functions like a catalyst. In addition, the reaction chamber where the reaction is performed is evacuated, and thus, $H_2O$ also needs to be fed properly, similar to $Ru(HFAC)_3$ or $H_2$ that is a substantial ingredient.

In this manner, according to the embodiment, $Ru(HFAC)_3$, $H_2O$ and $H_2$ were used to form the Ru film in hydrolysis, and thus a Ru film having an excellent film quality can be formed.

For example, an organic compound solution of Ru, such as a tetrahydrofuran solution of ethoxycyclopentadienylruthenium $(Ru(C_2H_5OC_5H_4)_2)$, is vaporized to react with $O_2$ whereby a Ru film can also be deposited. However, in this case, it is a reaction where incomplete combustion is generated to create Ru, so as not to oxidize Ru. Consequently, in addition to carbon, hydrogen or oxygen compounds of these elements, organic compounds or oxides thereof that are generated in reaction are taken into the Ru film to cause the film quality of the Ru film to be degraded. Furthermore, the annealing performed after this, such as annealing for densifying the Ru film, causes carbon, hydrogen or oxygen compounds of these elements, that have been taken into the Ru film, to be vaporized so as to degrade the film quality of the Ru film. Moreover, oxygen or oxygen compounds in the Ru film oxidize the WN film 29 that is to serve as an adhesive layer or the barrier layer 23, thereby to cause conducting failure between the plug 22 and the lower electrode (Ru film 30). Particularly, as described above, the conducting failure tends to occur when the diameter of the plug 22 is small.

Contrary to this, according to the embodiment, the hydrolysis of $Ru(HFAC)_3$ is utilized to generate the Ru film, and thus, by-products taken into the Ru film, such as carbon, hydrogen or compounds of these elements can be reduced. More specifically, the Ru film having an excellent crystalline property can be formed. Therefore, even though the annealing performed after this, such as annealing for densifying the Ru film, causes carbon, hydrogen or oxygen compounds of these elements, that have been taken into the Ru film, to be vaporized, the film quality of the Ru film can be maintained with a small amount of vaporization. Additionally, in annealing a capacitor dielectric to be formed above the lower electrode (Ru film 30), which is to be described later, the film shrinkage due to the vaporization of carbon in the Ru film can be made smaller, and the capacitor dielectric can be prevented from being damaged. Consequently, the characteristics of the information storage capacitor C can be enhanced. Furthermore, the amount of oxygen or oxygen compounds in the Ru film can be reduced, and the conducting failure between the plug 22 and the lower electrode (Ru film 30) can be avoided.

Figure 13:
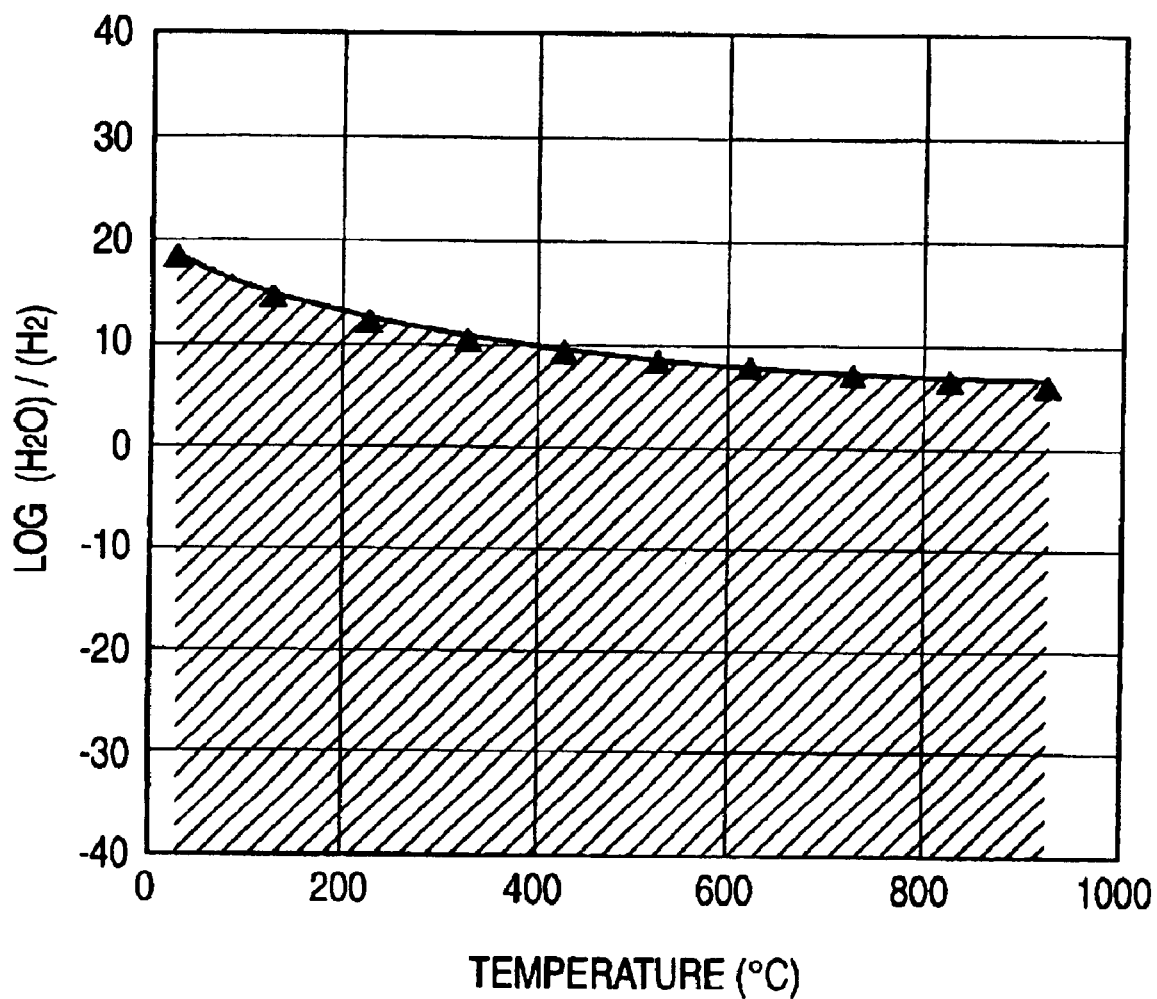
FIG. 13 is a graph illustrating a ratio of partial pressure of $H_2O$ to $H_2$ relative to temperature while forming the Ru film.
Figure 14:
FIGS. 14(a) and 14(b) are diagrams illustrating a depositing reaction of the Ru film.
Figure 14:
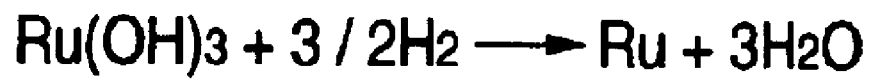

Moreover, the reason why the ratio of partial pressure of $H_2O$ to $H_2$ is controlled so as to be in the shaded area below the curve (a) shown in FIG. 13 is to suppress the oxidation of Ru in depositing the Ru film. That is, in depositing the Ru film, the reaction between $H_2O$ and Ru generated can cause aside reaction of generating $RuO_2$ (ruthenium oxide). Hereafter, the reason why this reaction (Ru oxidation) can be suppressed will be described.

The curve (a) shown in FIG. 13 depicts logarithms of the equilibrium constant k in terms of reaction temperatures in which a system 1 ($RuO_2$ $H_2$) and a system 2 ($Ru+H_2O$) are in equilibrium. It is expressed by logk log[[$H_2O$]eq/[$H_2$]eq], where [$H_2O$]eq is a partial pressure of $H_2O$ in equilibrium, and [$H_2$]eq is a partial pressure of $H_2$ in equilibrium. Additionally, this equilibrium constant k is determined by the difference ($\Delta G$) of the Gibbs free energy between the system 1 and the system 2, where $\Delta G$ is RTlnk.

Accordingly, under a condition of being in the area above the curve (a), a balance is moved into oxidizing Ru. However, when the Ru film is deposited while the ratio of partial pressure of $H_2O$ to $H_2$ is controlled to be in the shaded area below the curve (a) shown in FIG. 13, the oxidation of Ru can be suppressed.

At the same time, the deposition of the Ru film needs to vaporize a solution of $Ru(HFAC)_3$, which is the ingredient, and also the decomposition of the ingredient can occur when it is processed at high temperatures. Thus, it is considered that the reaction temperatures should be preferably from 100 to 200° C. (a boiling point of the ingredient or above) to about 500° C.

Therefore, according to the embodiment, a reaction was generated in which $Ru(HFAC)_3$, $H_2O$ and $H_2$ are used, and, further, the ratio of partial pressure of $H_2O$ to $H_2$ is controlled so as to be in the shaded area below the curve (a) shown in FIG. 13. Thus, the oxidation of the Ru film is prevented, and an excellent Ru film having a smaller content of oxygen, carbon or compounds of these elements can be formed.

Then, annealing is performed for one minute at a temperature of 700° C. to densify the Ru film 30. Additionally, the crystalline property of the Ru film is excellent, as described above. Therefore, less carbon is vaporized from the Ru film due to this annealing, and the film quality of the Ru film can be maintained.

Figure 15:
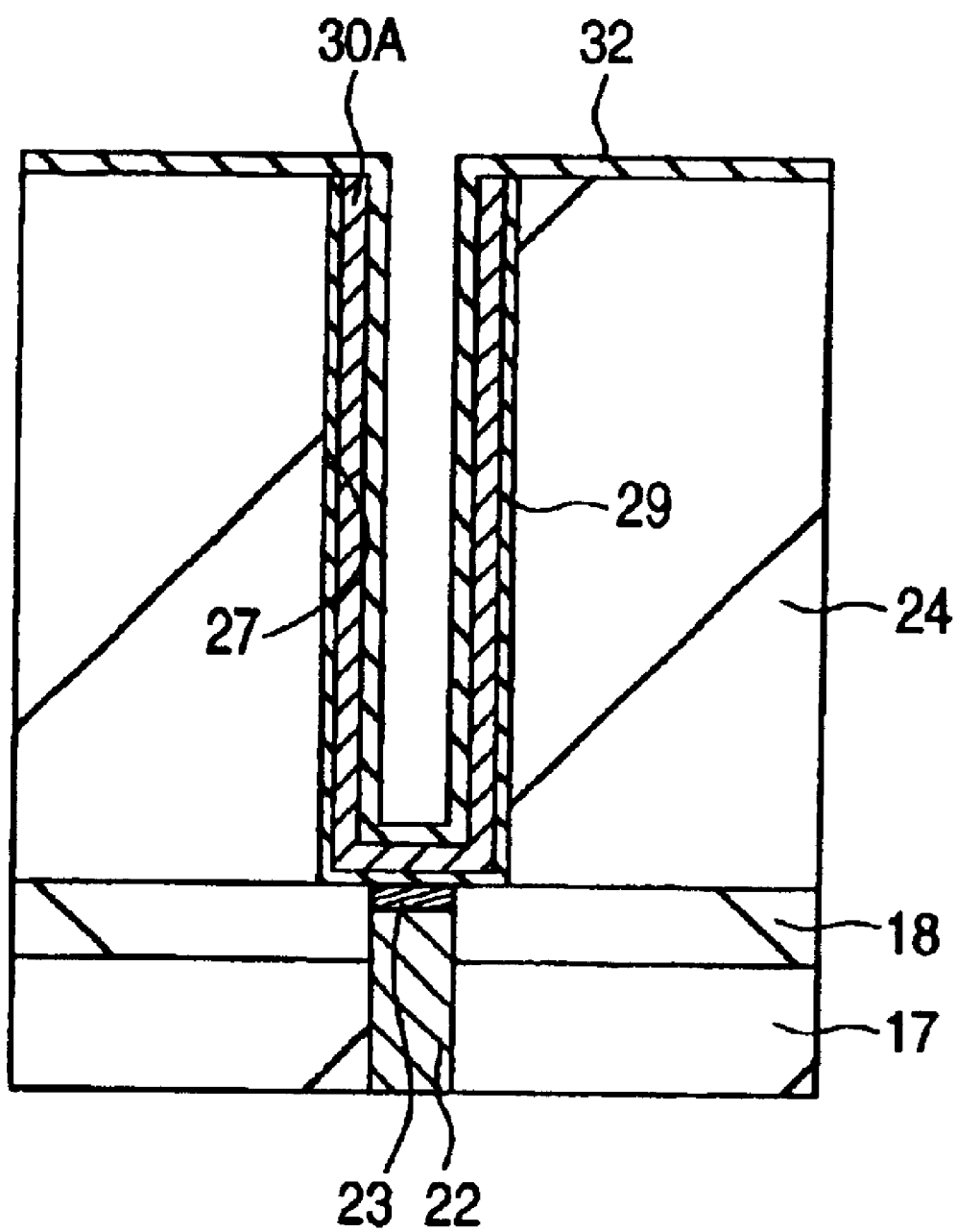
FIG. 15 is a section view of the semiconductor substrate illustrating a step in the method of manufacturing the semiconductor integrated circuit device representing the embodiment 1 of the invention.

Subsequently, as shown in FIG. 15, a photoresist film (not shown) is applied over the Ru film 30 to undergo exposure throughout the surface for development, whereby the photoresist film (not shown) is left inside the hole 27. This photoresist film is used as a protection film for preventing the Ru film 30 inside the hole 27 (sidewalls and bottom surface) from being eliminated during the removing of the unnecessary Ru film 30 above the silicon oxide film 24 in the subsequent step. Then, the photoresist film is used as a mask for dry etching to remove the Ru film 30 above the silicon oxide film 24, whereby the lower electrode 30A is formed. After that, the photoresist film inside the hole 27 is removed.

Then, the tantalum oxide film 32, having a film thickness of about 10 nm, which is to serve as a capacitor dielectric, is deposited inside the hole 27 and above the silicon oxide film 24, where the lower electrode 30A has been formed. The tantalum oxide film 32 is deposited by CVD using pentaethoxytantalum $(Ta(OC_2H_5)_5)$ and oxygen as ingredients. After that, it undergoes annealing in an Ar (argon) atmosphere at a temperature of 650° C. to crystallize the tantalum oxide. Furthermore, the Ru film has an excellent crystalline property, as described above. Thus,the film shrinkage of the Ru film during this annealing can be reduced, and the tantalum oxide film 32 can be prevented from being damaged.

Figure 16:
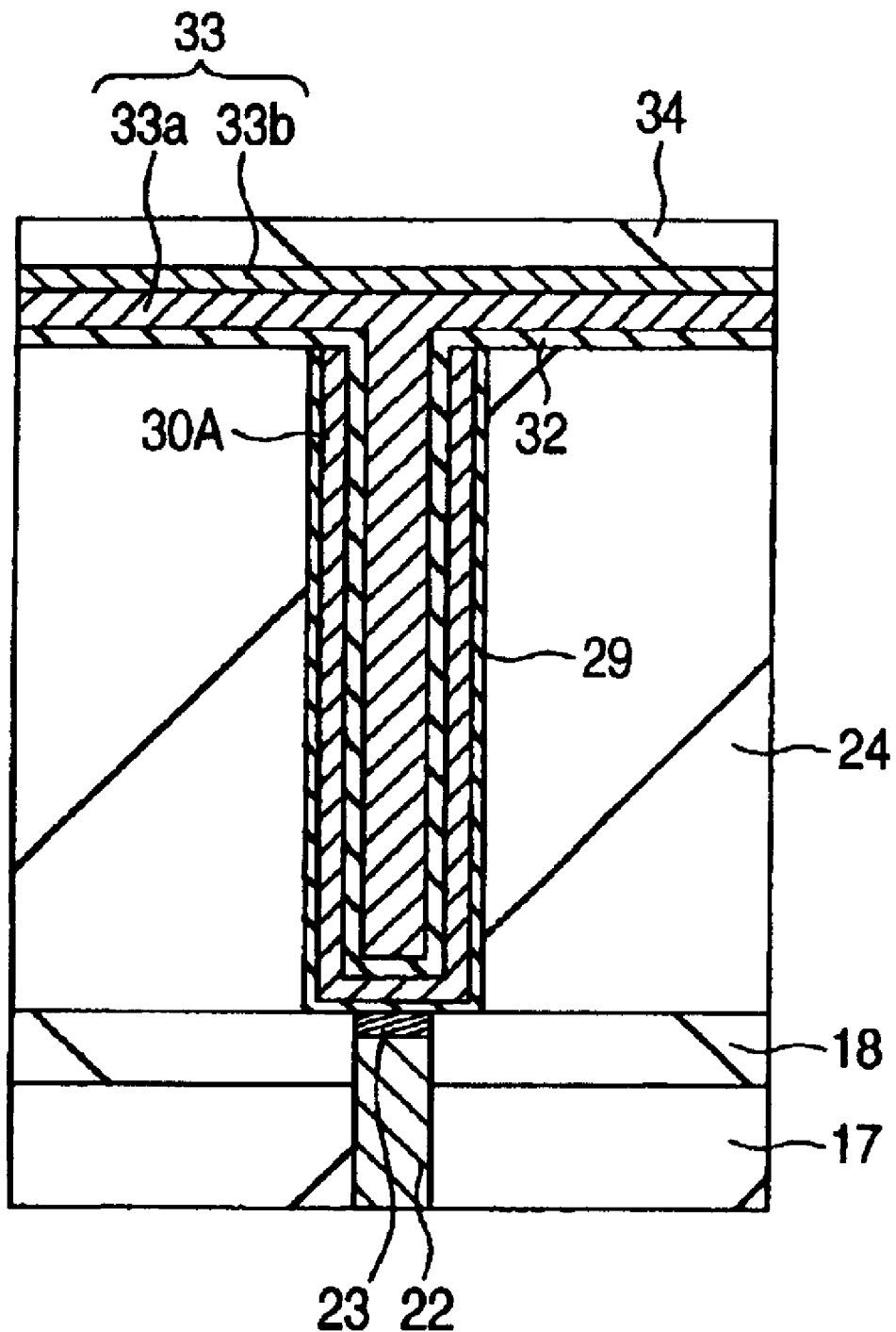
FIG. 16 is a section view of the semiconductor substrate illustrating a step in the method of manufacturing the semiconductor integrated circuit device representing the embodiment 1 of the invention.

Subsequently, as shown in FIG. 16, the upper electrode 33 is formed above the tantalum oxide film 32. The upper electrode 33 is formed by depositing a Ru film 33a (a film thickness of about 70 nm) and a W film 33b (a film thickness of about 100 nm) above the tantalum oxide film 32 by CVD, for example. The Ru film 33a may be formed in a manner similar to the formation of the Ru film 30. The W film 33b is used for reducing the contact resistance between the upper electrode 33 and interconnect lines in the upper layer. Moreover, a TiN film may be formed between the Ru film 33a and the W film 33b to prevent an increase in resistance due to the gas diffusion from the capacitor dielectric (tantalum oxide film 32) to the W film.

Figure 17:
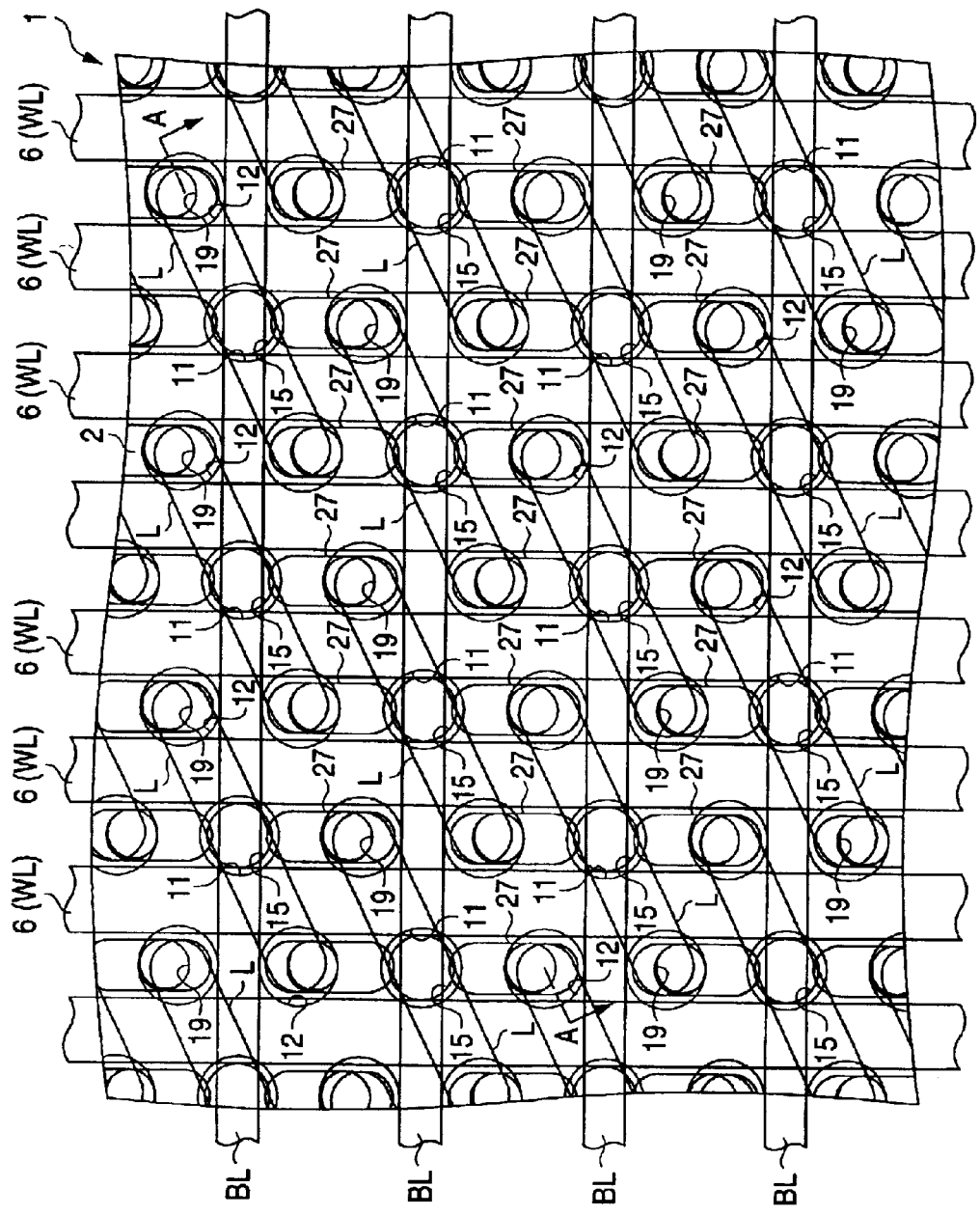
FIG. 17 is a plan view of the semiconductor substrate illustrating a step in the method of manufacturing the semiconductor integrated circuit device representing the embodiment 1 of the invention.

By the steps described up to now, the information storage capacitor C is completed, which is comprised of the lower electrode 30A formed of the Ru film 30, the capacitor dielectric film formed of the tantalum oxide film 32, and the upper electrode 33 formed of the W film 33b and the Ru film 33a. The memory cells of a DRAM are almost completed, which cells are configured of the memory cell selecting MISFETs Qs and the information storage capacitor C connected thereto in series. FIG. 17 depicts a plan view of the semiconductor substrate where the information storage capacitors C have been formed. FIG. 7 corresponds to a section taken along line A—A in FIG. 17, for example.

After that, an interlayer dielectric layer 34, comprised of a silicon oxide film, is formed above the information storage capacitor C, about two layers of Al interconnects are further formed above the interlayer dielectric layer, and a passivation film is formed above the uppermost layer of the Al interconnect, but these elements are omitted in the drawing.

As described above in detail, according to the embodiment, the hydrolysis of $Ru(HFAC)_3$ was utilized to generate the Ru film. Thus, by-products taken into the Ru film can be reduced, and the film quality of the Ru film can be enhanced.

Additionally, in the embodiment, the ratio of partial pressure of $H_2O$ to $H_2$ used in depositing the Ru film was controlled so as to be in the shaded area below the curve (a) shown in FIG. 13, and, therefore, the oxidation of the Ru film can be suppressed while depositing the Ru film.

Consequently, the characteristics of the information storage capacitor C can be enhanced, and the characteristics of the memory cells can be improved. Furthermore, a desired capacity can be secured even in the scaled-down memory cell structure.

Embodiment 2

In the embodiment 1, the Ru film 30 was formed in a process in which $Ru(HFAC)_3$, $H_2O$ and $H_2$ were used as ingredients and the ratio of partial pressure of $H_2O$ to $H_2$ was controlled so as to be in the shaded area below the curve (a) shown in FIG. 13. However, the Ru film may be formed under a condition where the ratio of partial pressure of $H_2O$ to $H_2$ is as described below.

Hereafter, a method to be used for manufacturing a DRAM in accordance with this embodiment will be described. Additionally, with regard to the steps of forming the WN film 29 serving as an adhesive layer, the description thereof will be omitted, because the process is the same as that employed in the case of the embodiment 1, that has been described with reference to FIGS. 1 to 11.

Figure 18:
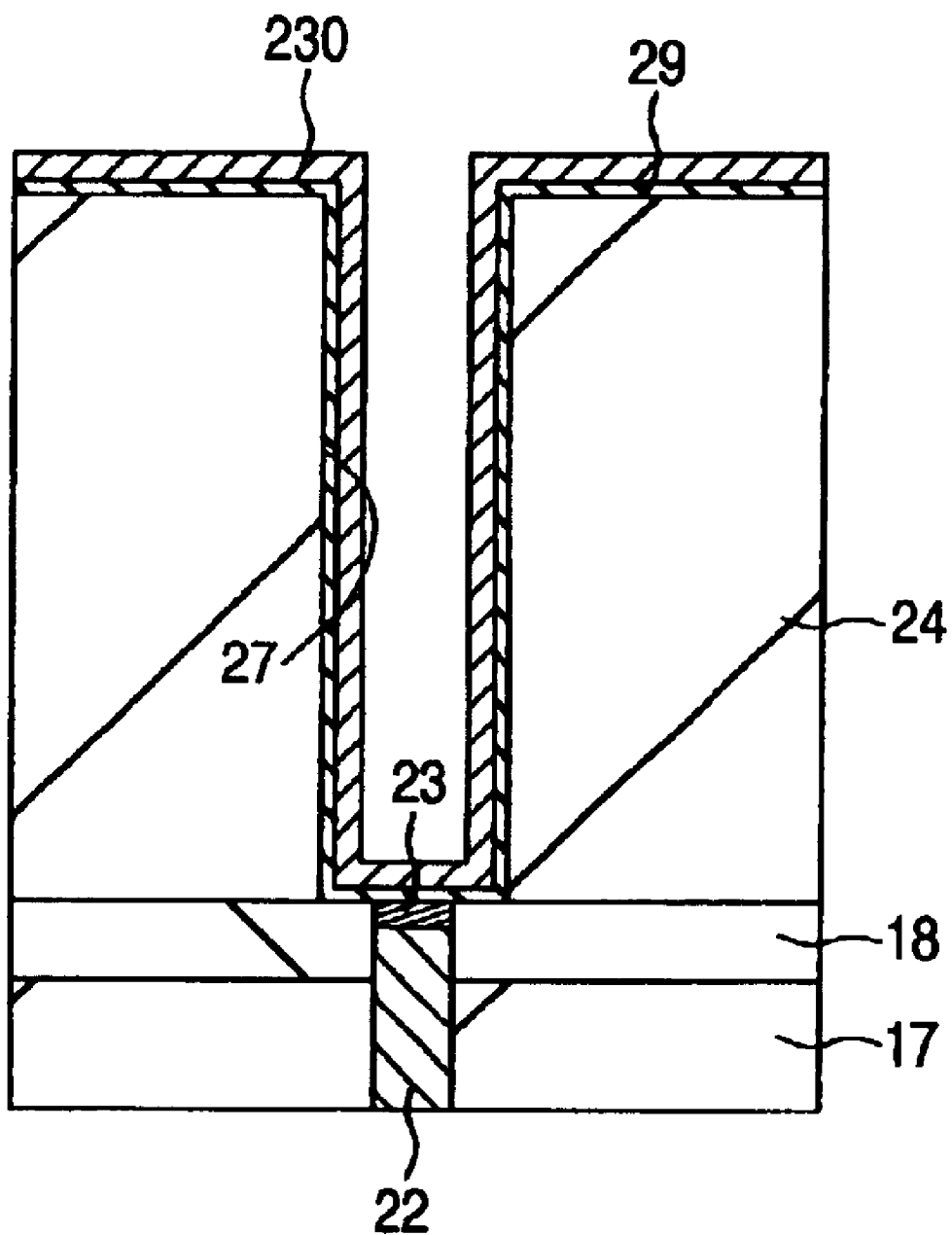
FIG. 18 is a section view of a semiconductor substrate illustrating a step in the method of manufacturing a semiconductor integrated circuit device representing an embodiment 2 of the invention.

As shown in FIG. 18, a Ru film having a film thickness of about 15 nm (not shown) is formed above the WN film 29 by sputtering, and then a Ru film 230 having a film thickness of about 30 nm is deposited by CVD.

Here, this Ru film 230 is to be formed by using Ru(HFAC), $H_2O$ and $H_2$ as ingredients, similar to the embodiment 1. However, at this time, the reaction is generated while the ratio of partial pressure of $H_2O$ to $H_2$ is controlled so as to be in the shaded area below the curve (b) shown in FIG. 19.

Figure 19:
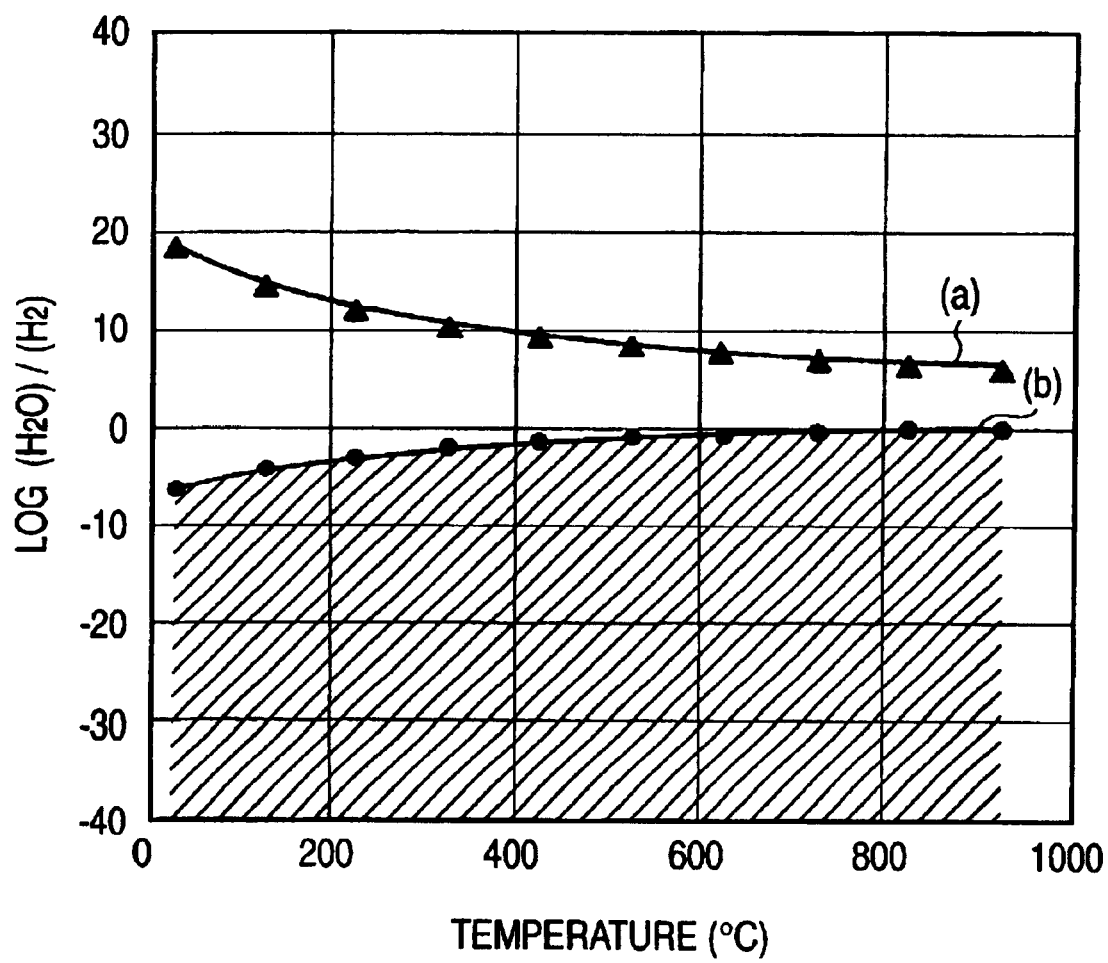
FIG. 19 is a graph illustrating a ratio of partial pressure of $H_2O$ to $H_2$ relative to temperature while forming the Ru film.

The curve (a) shown in FIG. 19 depicts logarithms of the equilibrium constant k in terms of reaction temperatures, in which a system 1 ($RuO_2+H_2$) and a system 2 ($Ru+H_2O$) are in equilibrium, whereas the curve (b) depicts logarithms of the equilibrium constant k in terms of reaction temperatures, in which a system 1 ($WO_2+H_2$) and a system 2 ($W+H_2O$) are in equilibrium. As described in the embodiment 1, it is expressed by logk $\log[[H_2O]eq/[H_2]eq]$, where $[H_2O]eq$ is a partial pressure of $H_2O$ in equilibrium, $[H_2]eq$ is a partial pressure of $H_2$ in equilibrium, and this equilibrium constant k is determined by the difference ($\Delta G$) of the Gibbs free energy between the system 1 and the system 2.

Accordingly, under a condition of being in the area above the curve (b), a balance is moved into oxidizing W. However, when the Ru film is deposited while the ratio of partial pressure of $H_2O$ to $H_2$ is controlled so as to be in the shaded area below the curve (b) shown in FIG. 19, the oxidation of Ru is suppressed and the oxidation of W can also be suppressed.

Figure 20:
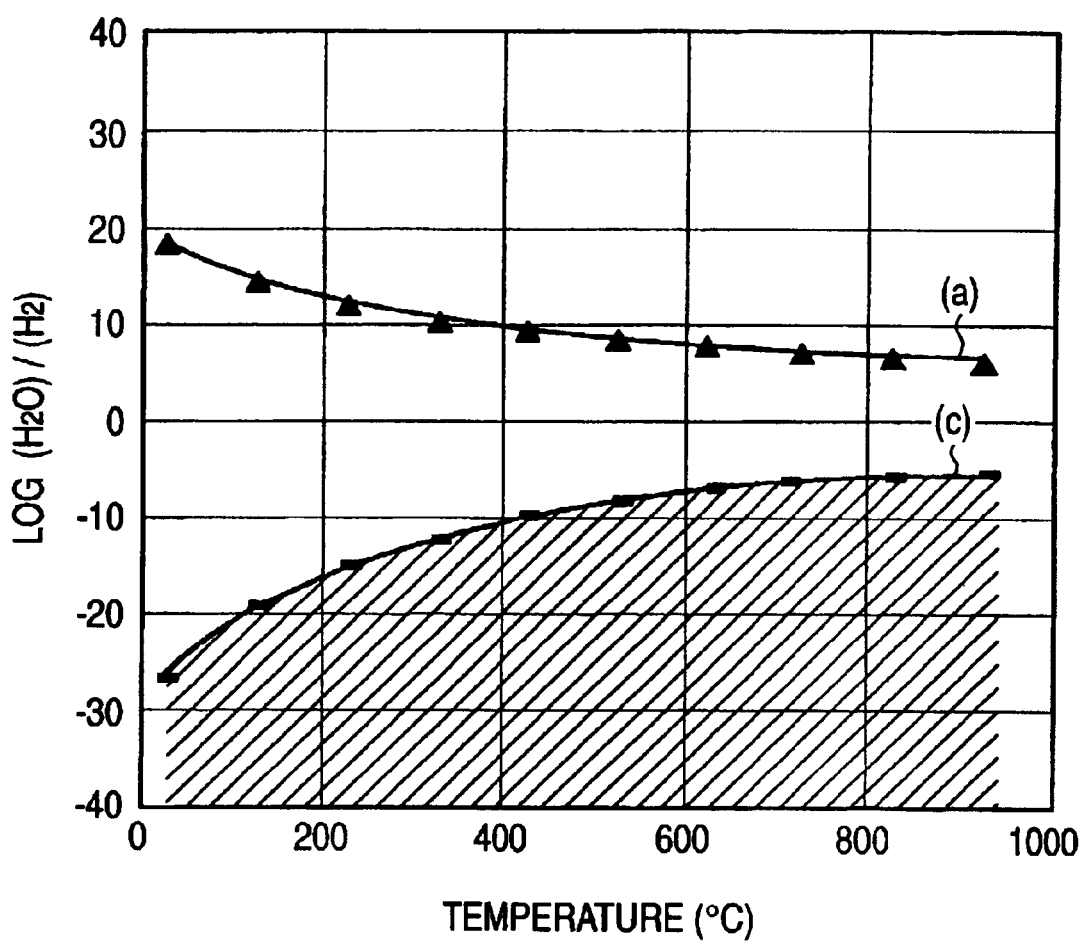
FIG. 20 is a graph illustrating a ratio of partial pressure of $H_2O$ to $H_2$ relative to temperature while forming the Ru film.

Consequently, in addition to the effect described in the embodiment 1, the oxidation of W in the WN film 29 serving as an adhesive layer, or of the barrier film 23, can be suppressed. Therefore, the conducting failure between the Ru film 230 (lower electrode) and the plug 22 can be prevented. Additionally, the oxidation of W can also be suppressed in the case where the WN film 29 or barrier film 23 is formed of a W film. Furthermore, in the case where the WN film 29 or barrier film 23 is formed of a TaN film, when the reaction is generated while the ratio of partial pressure of $H_2O$ to $H_2$ is controlled so as to be in the shaded area below the curve (c) shown in FIG. 20 in forming the Ru film, the oxidation of Ta in the TaN film can be suppressed. The curve (c) shown in FIG. 20 depicts logarithms of the equilibrium constant k in terms of reaction temperatures, in which a system 1 ($Ta_2O_5+H_2$) and a system 2 ($Ta+H_2O$) are in equilibrium.

Then, annealing is performed for one minute at a temperature of 700° C. to densify the Ru film 230.

The steps after this are the same as the steps employed in the case of the embodiment 1, that have been described with reference to FIGS. 15 and 16, and thus the description thereof will be omitted.

As described above in detail, according to this embodiment, the Ru film 230 was formed in a process in which $Ru(HFAC)_3$, $H_2O$ and $H_2$ were used as ingredients, and the ratio of partial pressure of $H_2O$ to $H_2$ was controlled so as to be in the shaded area below the curve (b) shown in FIG. 19. Thus, with this procedure, the oxidation of W lying under the Ru film or of the film comprised of W compounds can be suppressed, and the conducting failure between the Ru film 230 (lower electrode) and the plug 22 can be prevented. Consequently, the characteristics of the information storage capacitor C can be enhanced, and the characteristics of the memory cells can be improved.

Figure 21:
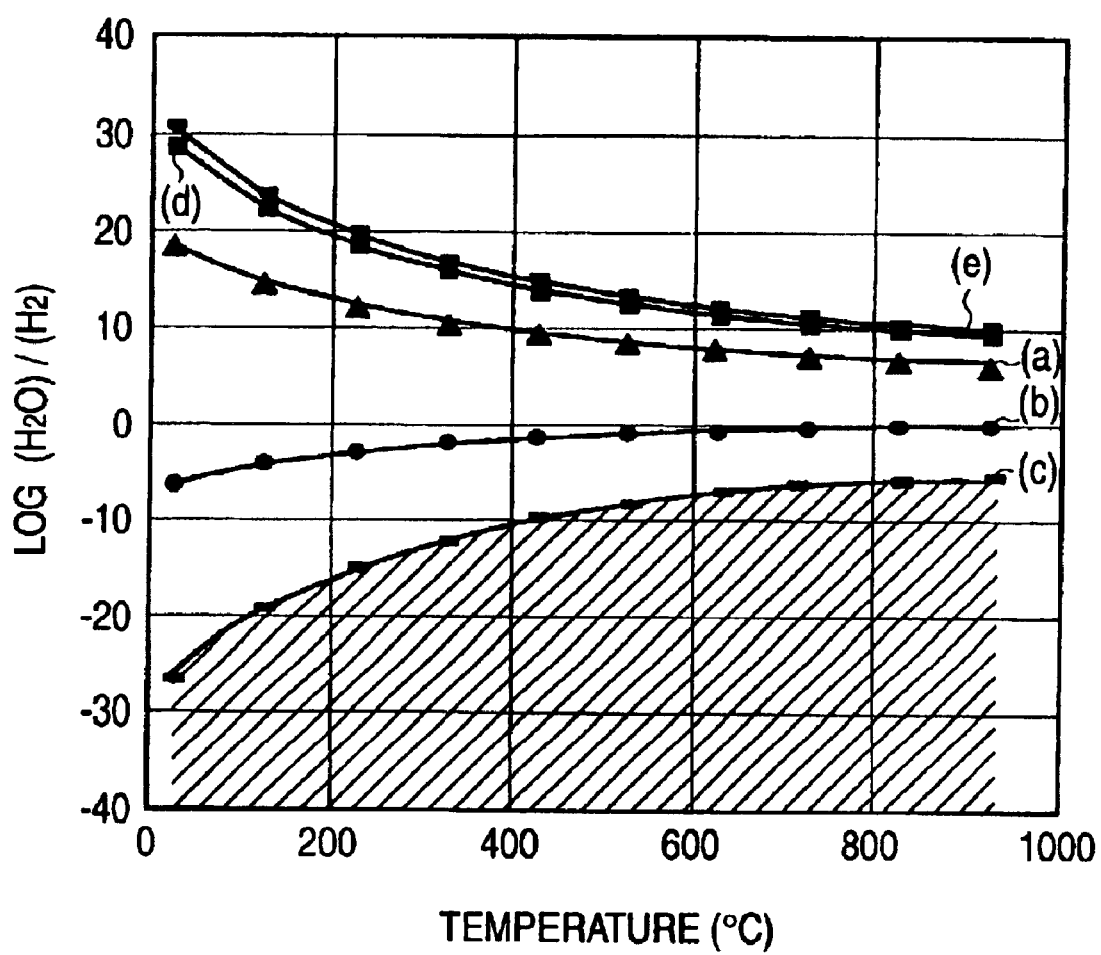
FIG. 21 is a graph illustrating a ratio of partial pressure of $H_2O$ to $H_2$ relative to temperature while forming the Ru film.

In addition, the Ru film was exemplified in the description of the embodiments 1 and 2. However, an Ir (iridium) film, Pd (palladium) film or Pt (platinum) film and the like can also form hexafluoroacetylacetone and a complex compound (acetylacetonate derivative). Thus, when complex compounds of these elements, $H_2O$ and $H_2$ are used as ingredients to form metal films of these materils, while the ratio of partial pressure of $H_2O$ to $H_2$ is controlled similar to that of the embodiments 1 and 2, the same effect can be obtained (see FIG. 21). Curves (d) and (e) in FIG. 21 depict logarithms of the equilibrium constant k in terms of reaction temperatures in a process in which a system 1 ($IrO_2+H_2$) and a system 2 ($Ir+H_2O$) are in equilibrium, and logarithms of the equilibrium constant k in terms of reaction temperatures in a process in which a system 1 ($PdO+H_2$) and a system 2 ($Pd+H_2O$) are in equilibrium, respectively. Particularly, Ru or Ir tends to obtain the complex compounds described above, which is preferable for use as the lower electrode.

Embodiment 3

In the embodiments 1 and 2, the ratio of partial pressure of $H_2O$ to $H_2$ was controlled while depositing the Ru film. However, the ratio of partial pressure of $H_2O$ to $H_2$ may be controlled to form the tantalum oxide film ($Ta_2O_5$) to be used as the capacitor dielectric, as described below.

Hereafter, a method to be used for manufacturing a DRAM of this embodiment will be described. Again, the steps of forming the lower electrode 30A are the same as those employed in the case of the embodiment 1, that has been described with reference to FIGS. 1 to 15, and thus the description thereof will be omitted. Furthermore, the Ru film 30, configuring the lower electrode 30A, may be formed according to the method described in the embodiment 2.

Figure 22:
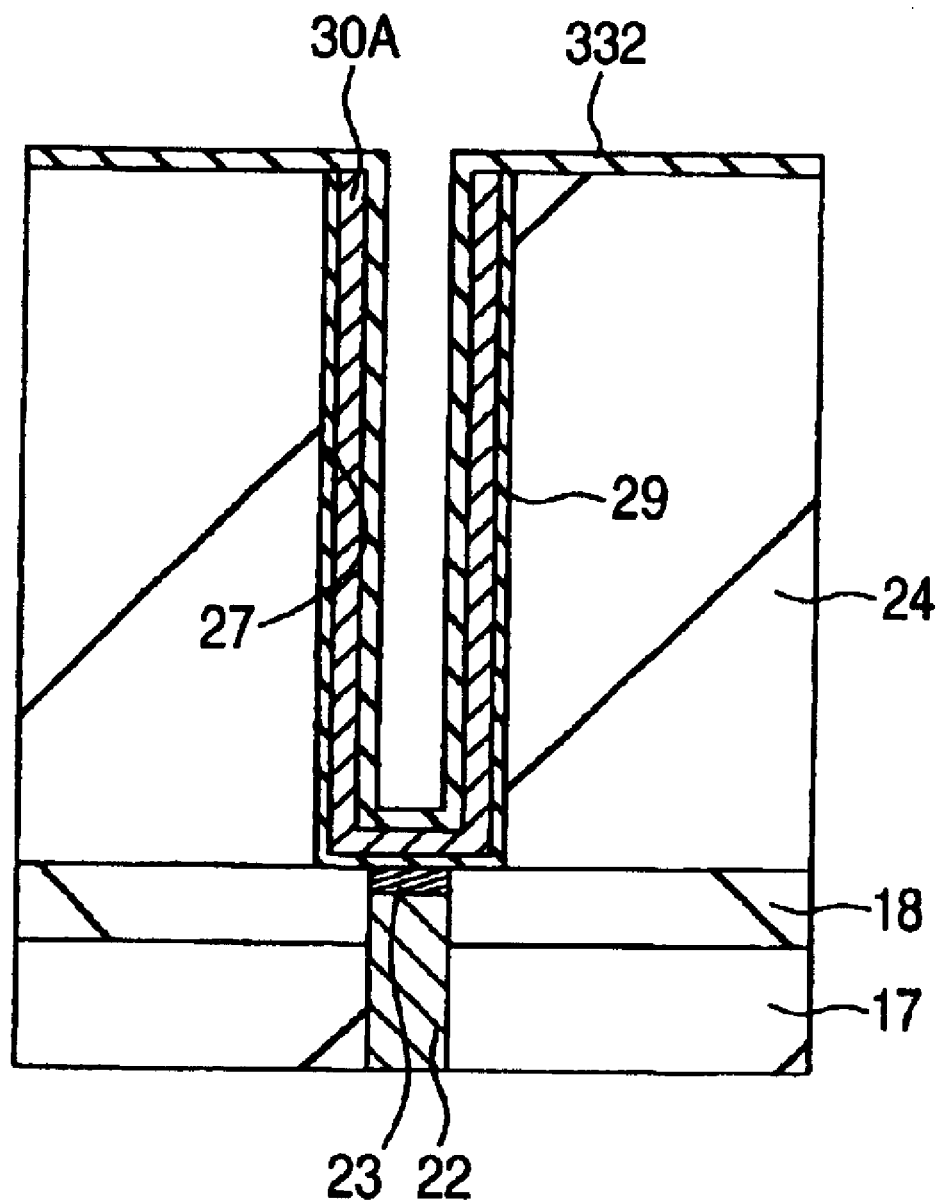
FIG. 22 is a section view of a semiconductor substrate illustrating a step in the method of manufacturing a semiconductor integrated circuit device representing an embodiment 3 of the invention.

Inside of the hole 27 and on the silicon oxide film 24, where the lower electrode 30A has been formed, a tantalum oxide film 332 having a film thickness of about 10 nm, which is to serve as the capacitor dielectric is deposited, as shown in FIG. 22. The tantalum oxide film 332 is deposited by CVD using pentaethoxytantalum ($Ta(OC_2H_5)_5$) and $H_2O$ as ingredients.

In this manner, according to the embodiment, pentaethoxytantalum ($Ta(OC_2H_5)_5$) and $H_2O$ were used to form the tantalum oxide film 332, and thus the tantalum oxide film 332, having an excellent film quality can be formed.

More specifically, as described in the embodiment 1, the tantalum oxide film 332 may be deposited by CVD using pentaethoxytantalum ($Ta(OC_2H_5)_5$) and oxygen as ingredients, but in this case, carbon or compounds thereof are taken into the tantalum oxide film 332 to cause the film quality of the tantalum oxide film to be degraded. Furthermore, oxygen is used as an ingredient, and, therefore, it might oxidize the lower electrode 30A (Ru film) lying under the tantalum oxide film 332, the WN film 29 serving as an adhesive layer or the barrier layer 23. When these films are oxidized, a conducting failure between the Ru film 30 (lower electrode) and the plug 22 is generated. Particularly, the conducting failure tends to occur when the diameter of the plug is small.

Contrary to this, according to the embodiment, the hydrolysis of pentaethoxytantalum ($Ta(OC_2H_5)_5$) was utilized to generate the tantalum oxide film 332. Therefore, by-products taken into the tantalum oxide film 332, such as carbon or compounds thereof, can be reduced, and the tantalum oxide film 332 having an excellent film quality can be formed. Moreover, oxygen is not used as an ingredient. Thus, the underlayer of the tantalum oxide film 332 can be prevented from oxidizing, and a conducting failure between the plug 22 and the lower electrode (Ru film) 30A can be prevented.

Additionally, the tantalum oxide film 332 may be formed by using pentaethoxytantalum ($Ta(OC_2H_5)_5$), $H_2O$ and $H_2$ under the following condition.

Figure 23:
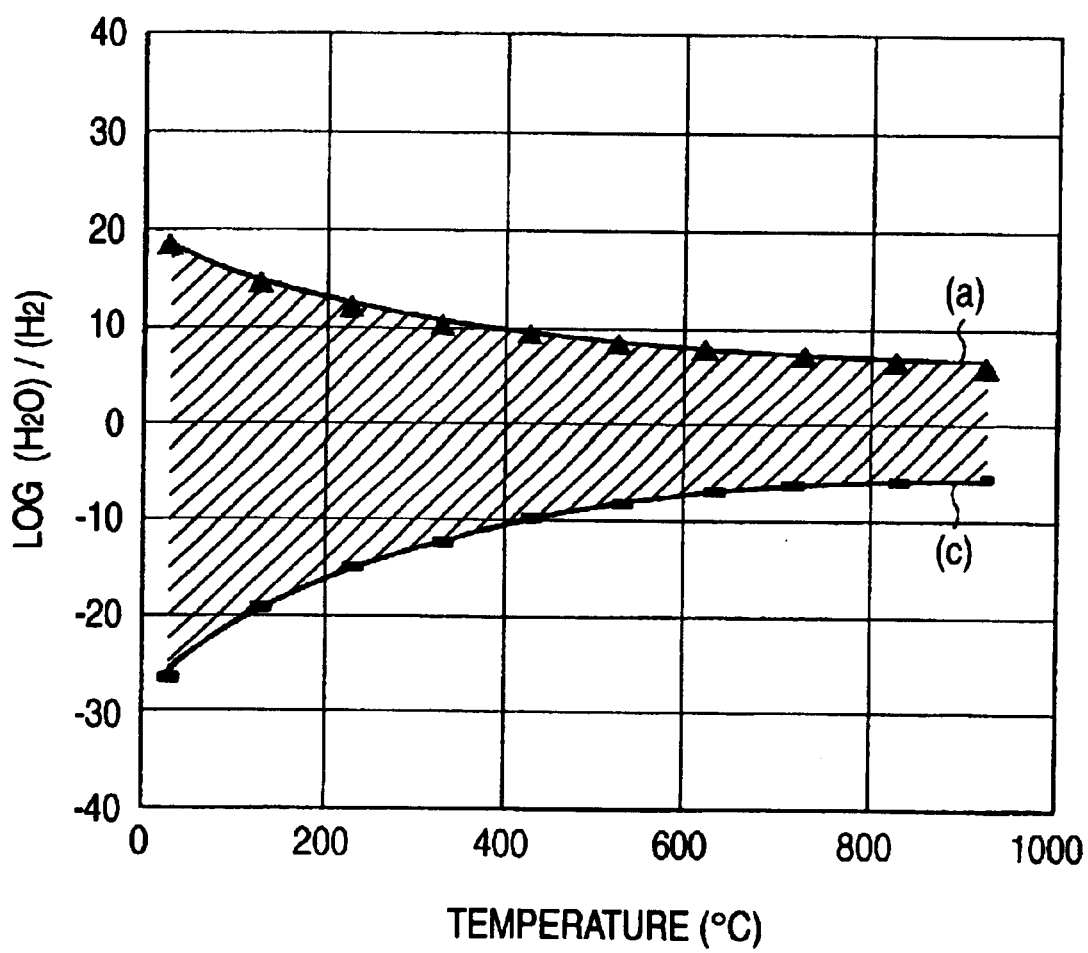
FIG. 23 is a graph illustrating a ratio of partial pressure of $H_2O$ to $H_2$ relative to temperature while forming the tantalum oxide film.

More specifically, the reaction is generated while the ratio of partial pressure of $H_2O$ to $H_2$ is controlled to be in the shaded area bounded by curves (a) and (c), as shown in FIG. 23.

The curve (c) shown in FIG. 23 depicts logarithms of the equilibrium constant k in terms of reaction temperatures in which a system 1 ($Ta_2O_5+H_2$) and a system 2 ($Ta+H_2O$) are in equilibrium. As described in the embodiment 1, it is expressed by logk log[[$H_2O$]eq/[$H_2$]eq], where [$H_2O$]eq is a partial pressure of $H_2O$ in equilibrium, [$H_2$]eq is a partial pressure of $H_2$ in equilibrium, and this equilibrium constant k is determined by the difference ($\Delta G$) of the Gibbs free energy between the system 1 and the system 2.

Accordingly, under a condition of being in the area below the curve (c), a balance is moved into oxidizing $Ta_2O_5$, and thus the ratio of partial pressure of $H_2O$ to $H_2$ needs to be controlled so as to be in the area above the curve (c) shown in FIG. 23 for depositing the tantalum oxide film 332. Here, as described in the embodiment 1, when the ratio of partial pressure of $H_2O$ to $H_2$ is controlled so as to be in the area below the curve (a) shown in FIG. 23, the oxidation of Ru can be suppressed. However, the deposition of the tantalum oxide film needs an ingredient solution to vaporize, and decomposition of the ingredient can occur when it is processed at high temperatures. Therefore, it is considered that the reaction temperatures should be preferably about 100 to 200° C. (a boiling point or above of the ingredient solution) to 500° C.

In this manner, according to the embodiment, a reaction was generated in which pentaethoxytantalum ($Ta(OC_2H_5)_5$), $H_2O$ and $H_2$ were used, and the ratio of partial pressure of $H_2O$ to $H_2$ was controlled so as to be in the shaded area bounded by the curves (a) and (c) shown in FIG. 23. Thus, the tantalum oxide film 332 can be deposited while the Ru film is prevented from oxidizing.

Figure 24:
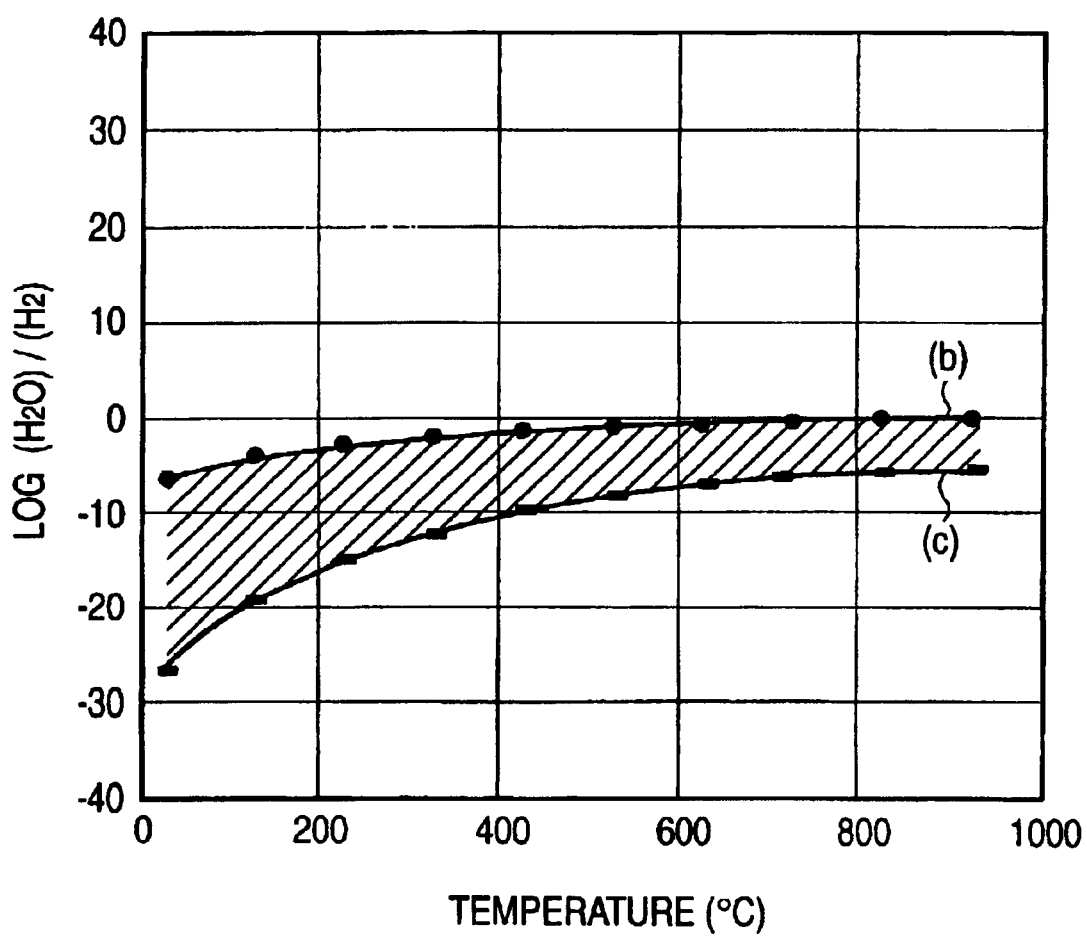
FIG. 24 is a graph illustrating a ratio of partial pressure of $H_2O$ to $H_2$ relative to temperature while forming the tantalum oxide film.

Furthermore, when the reaction is generated while the ratio of partial pressure of $H_2O$ to $H_2$ is controlled so as to be in the shaded area bounded by curves (b) and (c), as shown in FIG. 24, the tantalum oxide film 332 can be deposited while the Ru film or WN film is prevented from oxidizing, as described in the embodiment 2.

Then, annealing is performed in an Ar(argon) atmosphere at a temperature of 650° C. to crystallize the tantalum oxide film 332.

After that, the upper electrode 33 is formed above the tantalum oxide film 332 in a manner similar to that used in the embodiment 1 (see FIG. 16).

As described above in detail, according to the embodiment, a reaction was generated in which pentaethoxytantalum ($Ta(OC_2H_5)_5$), $H_2O$ and $H_2$ were used and the ratio of partial pressure of $H_2O$ to $H_2$ was further controlled. Therefore, using this procedure, the tantalum oxide film 332 can be deposited while the film (Ru film or WN film) under the tantalum oxide film 332 is prevented from oxidizing.

Accordingly a conducting failure between the Ru film 30 (lower electrode) and the plug 22 can be prevented. Consequently, the characteristics of the information storage capacitor C can be enhanced, and the characteristics of the memory cells can be improved.

Additionally, in the embodiment, although a tantalum oxide film was used as the capacitor dielectric, $Al_2O_3$ or BST ($Ba_xSr_{1-x}TiO_3$) may be used as well.

When $Al(CH_3)_2H$ (dimethylaluminumhydride), $H_2O$ and $H_2$ are used as ingredients to form an $Al_2O_3$ film while the ratio of partial pressure of $H_2O$ to $H_2$ is controlled as in the embodiment, the same effect can be obtained.

Furthermore, a BST film can be formed by using Ba(C(CH$_3$)$_3$—CO—CH—CO—C(CH$_3$)$_3$)$_2$bis(dipivaloylmetanate)barium, Sr(C(CH$_3$)$_3$—CO—CH—COC(CH$_3$)$_3$)$_2$bis(dipivaloylmetanate)strontium, or TiO(C(CH$_3$)$_3$—CO—CH—CO—C(CH$_3$)$_3$)$_2$titanylbis(dipivaloylmetanate), H$_2$O and H$_2$ as ingredients. Also in this case, when the BST film is formed while the ratio of partial pressure of H$_2$O to H$_2$ is controlled as in the embodiment, the same effect can be obtained.

Moreover, in the embodiments 1 to 3, the memory cells of the DRAM were exemplified for purposes of description, but the invention can widely be adapted to semiconductor integrated circuit devices having a MIM (Metal Insulator Metal) capacitor and need not be limited to a DRAM.

Embodiment 4

In the embodiments 1 to 3, the invention was applied to the information storage capacitor of a DRAM, but the invention may be applied as well to interconnect lines. Next, a method of manufacturing a semiconductor integrated circuit device according to an embodiment of the invention will be described. FIGS. 25 to 28 and FIGS. 32 to 35 show sections of a substrate illustrating steps in the method of production of a semiconductor integrated circuit device representing an embodiment of the invention.

Figure 25:
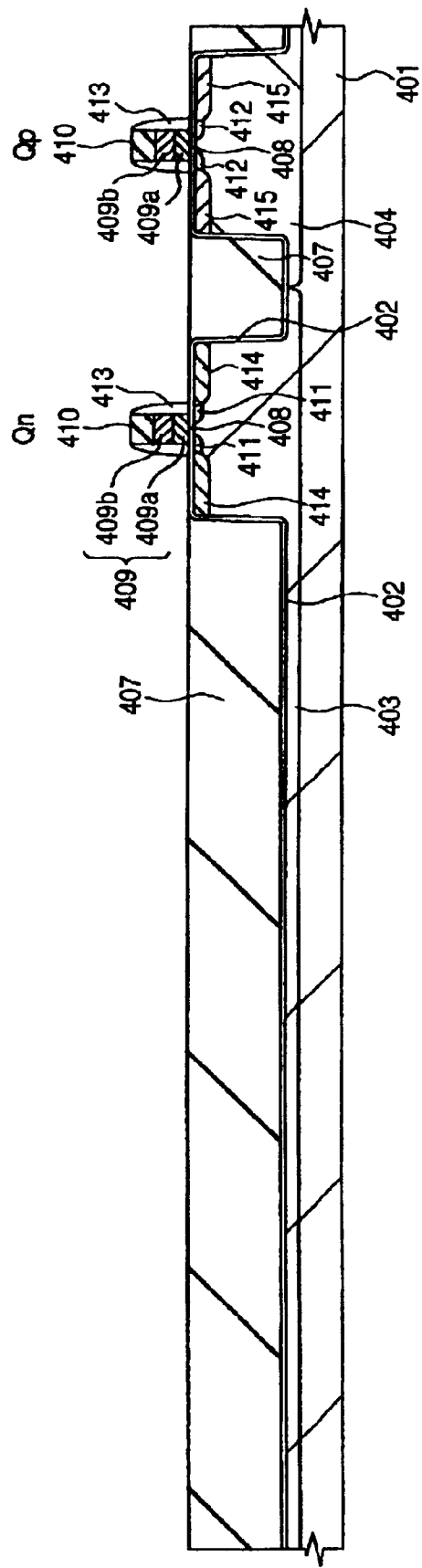
FIG. 25 is a section view of a semiconductor substrate illustrating a step in the method of manufacturing a semiconductor integrated circuit device representing an embodiment 4 of the invention.

First, as shown in FIG. 25, an n-channel MISFET Qn and a p-channel MISFET Qp are formed according to the general steps of forming MISFETs. For example, the general steps of forming MISFETs are as follows.

First, a semiconductor substrate 401 comprised of p-type monocrystalline silicon is etched to form a device isolating trench 402, and the substrate 401 is thermally oxidized to form a thin silicon oxide film on the inner walls of the trench. Then, a silicon oxide film 407 is deposited by CVD above the substrate 401, including the inside of the trench, and the silicon oxide film 407 above the trench is polished by CMP to planarize the surface.

Subsequently, a p-type impurity and an n-type impurity are ion-implanted into the substrate 401; the impurities are diffused by annealing to form a p-well 403 and an n-well 404; and then, a clean gate oxide film 408 having a film thickness of about 6 nm is formed over each of the surfaces of the p-well 403 and the n-well 404.

After that, a low-resistance polycrystalline silicon film 409a doped with phosphorous is deposited above the gate oxide film 408 by CVD; a thin WN film (not shown) and a W film 409b are deposited thereabove by sputtering; and then, a silicon nitride film 410 is further deposited thereabove by CVD.

Subsequently, the silicon nitride film 410 is dry-etched to leave the silicon nitride film 410 in the area to form a gate electrode, and the silicon nitride film 410 is used as a mask to dry-etch the W film 409b and the WN film (not a shown), whereby a gate electrode 409, that is comprised of the polycrystalline silicon film 409a, the WN film and the W film 409b, is formed.

Then, an n-type impurity is ion-implanted into the p-well 403 on both sides of the gate electrode 409 to form n semiconductor regions 411, and a p-type impurity is ion-implanted into the n-well 404 to form p semiconductor regions 412.

Subsequently, a silicon nitride film is deposited above the substrate 401 by CVD for anisotropic etching, whereby a sidewall spacer 413 is formed on the sidewalls of the gate electrode 409.

After that, an n-type impurity is ion-implanted into the p-well 403 to form n semiconductor regions 414 (source/drain), and a p-type impurity is ion-implanted into the n-well 404 to form p semiconductor regions 415 (source/drain).

By the steps described up to now, the n-channel MISFET Qn and the p-channel MISFET Qp, having a source and drain of the LDD (Lightly Doped Drain) structure, are formed.

After this, an interlayer dielectric, such as a silicon oxide film, and a conductive film, such as a Cu film are alternately deposited above the MISFETs Qn and Qp to form a plurality of interconnect lines. The formation of the interlayer dielectric and the interconnect lines will be described in detail with reference to FIGS. 26 to 35.

Figure 26:
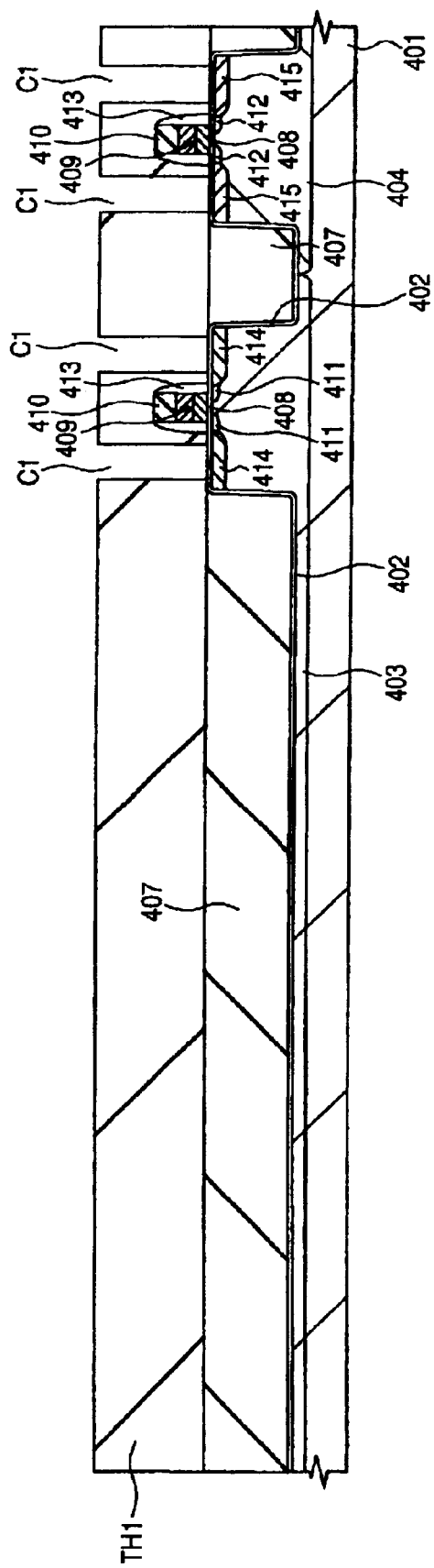
FIG. 26 is a section view of the semiconductor substrate illustrating a step in the method of manufacturing the semiconductor integrated circuit device representing the embodiment 4 of the invention.

First, as shown in FIG. 26, a silicon oxide film, having a film thickness of about 700 to 800 nm, is deposited above the MISFETs Qn and Qp by CVD, and then the silicon oxide film is polished by CMP to planarize the surface, thereby to form an interlayer dielectric TH1.

Subsequently, a photoresist film (not shown) is formed above the interlayer dielectric TH1, and the photoresist film is used as a mask to etch the interlayer dielectric TH1, whereby contact holes C1 are formed above the n semiconductor regions 414 and the p semiconductor regions 415 on the front surface of the semiconductor substrate 401.

Figure 27:
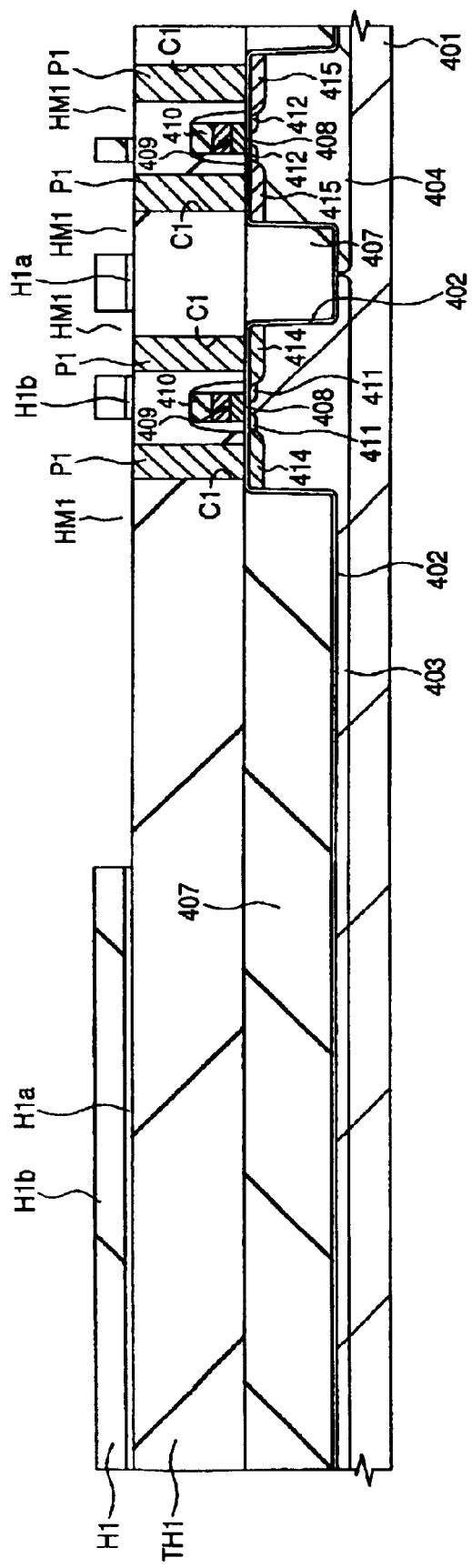
FIG. 27 is a section view of the semiconductor substrate illustrating a step in the method of manufacturing the semiconductor integrated circuit device representing the embodiment 4 of the invention.

Then, as shown in FIG. 27, a tungsten film is deposited by CVD above the interlayer dielectric TH1, including the inside of the contact holes C1, and the tungsten film is polished by CMP until the interlayer dielectric TH1 is exposed, whereby a plug P1 is formed inside the contact holes C1. Additionally, a thin TiN film may be deposited before depositing the tungsten film so as to form the plug 1 into a laminated structure that is comprised of the tungsten film and a barrier film formed of the TiN film.

After that, a silicon nitride film H1a and a silicon oxide film H1b are sequentially deposited above the interlayer dielectric TH1 and the plugs P1 by CVD to form an interconnecting trench dielectric H1 comprised of these films. The interconnecting trench dielectric H1, in the area where a first interconnect layer is to be formed, is etched to form interconnecting trenches HM 1. Furthermore, the silicon nitride film H1a is used as an etching stopper in the etching described above.

Figure 28:
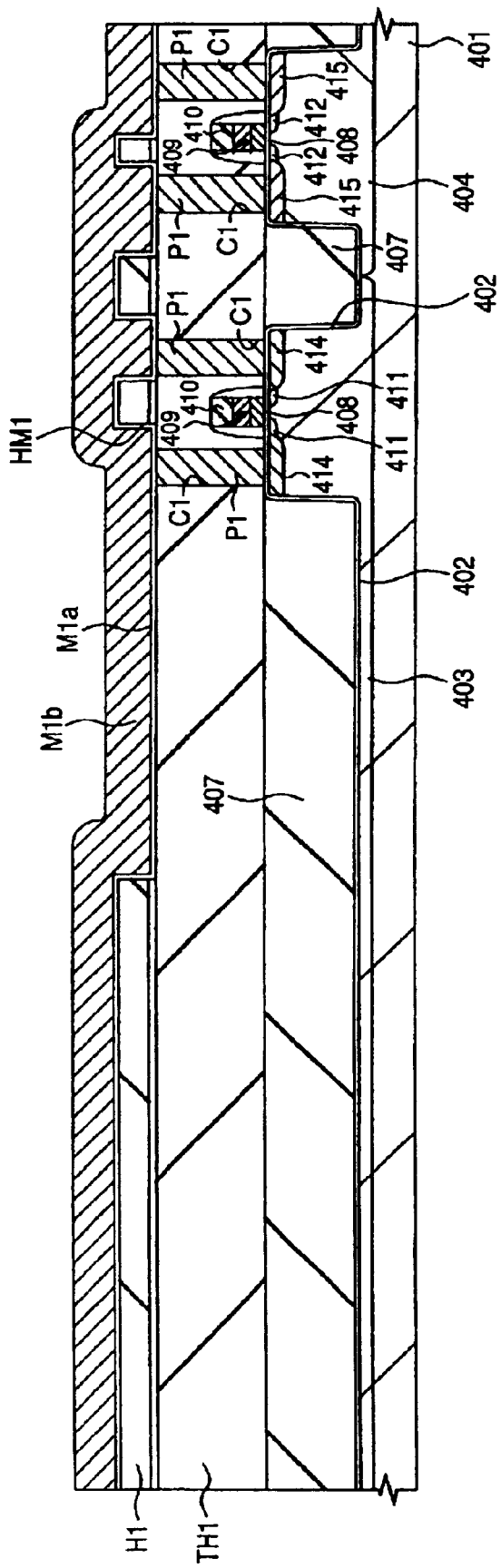
FIG. 28 is a section view of the semiconductor substrate illustrating a step in the method of manufacturing the semiconductor integrated circuit device representing the embodiment 4 of the invention.

Then, as shown in FIG. 28, a barrier layer M1a, comprised of tungsten nitride, is deposited above the interconnecting trench dielectric H1, including the inside of the interconnecting trench HM 1 by sputtering. Subsequently, a Cu film M1b is formed above the barrier layer M1a by CVD.

This Cu film M1b is formed by using Cu(HFAC)$_2$, which is a compound of Cu (copper), H$_2$O and H$_2$ as ingredients. In addition, HFAC means (CF$_3$COCHCOCF$_3$).

An organic compound solution of Cu(HFAC)$_2$ is vaporized to react with H$_2$O and H$_2$ for deposition. Furthermore, a tetrahydrofuran solution is provided as the organic compound solution. Here, the reaction is generated while the ratio of partial pressure of H$_2$O to H$_2$ is controlled so as to be in the shaded area below the curve (a') shown in FIG. 29.

The reason for control in this manner is to suppress the oxidation of Cu while depositing the Cu film. The reason why the oxidation of Cu is allowed to be suppressed can also be described in a manner similar to the case of Ru.

Figure 29:
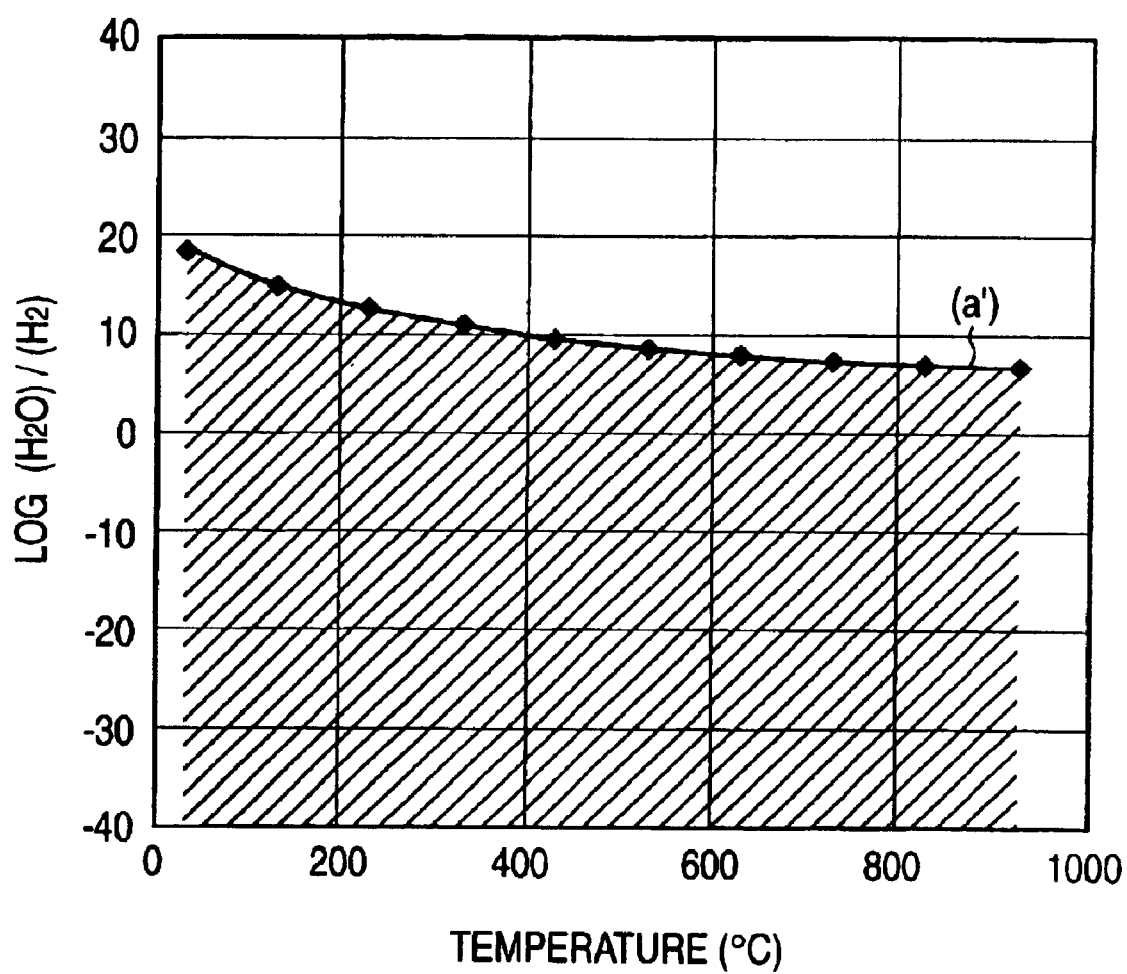
FIG. 29 is a graph illustrating a ratio of partial pressure of $H_2O$ to $H_2$ relative to the temperature while forming the Cu film.

More specifically, FIG. 29 depicts logarithms of the equilibrium constant k in terms of reaction temperatures, in which a system 1 (CuO+H$_2$) and a system 2 (Cu+H$_2$O) are in equilibrium. It is expressed by logk log[[H$_2$O]eq/[H$_2$]eq], where $[H_2O]$eq is a partial pressure of $H_2O$, and $[H_2]$eq is a partial pressure of $H_2$. Moreover, this equilibrium constant k can be determined by the difference ($\Delta G$) of the Gibbs free energy between the system 1 and the system 2, where $\Delta G$ is —RTlnk.

Accordingly, under a condition of being in the area above the curve (a'), a balance is moved into oxidizing Cu. However, when the Cu film is deposited while the ratio of partial pressure of $H_2O$ to $H_2$ is controlled so as to be in the shaded area below the curve (a') shown in FIG. 29, the oxidation of Cu can be suppressed.

However, the solution of $Cu(HFAC)_2$, to be an ingredient, needs to be vaporized in depositing the Cu film, and the decomposition of the ingredient is able to occur when processed at high temperatures. Thus, it is considered that the reaction temperatures should preferably be from 100 to 200° C. (a boiling point or above of the ingredient solution) to 500° C.

In this manner, according to the embodiment, a reaction was generated in which $Cu(HFAC)_2$, $H_2O$ and $H_2$ were used, and the ratio of partial pressure of $H_2O$ to $H_2$ was controlled to be in the shaded area below the curve (a') shown in FIG. 29. Therefore, the Cu film is prevented from oxidizing, and the Cu film having a smaller content of oxygen, carbon or a compound of these can be formed.

Figure 30:
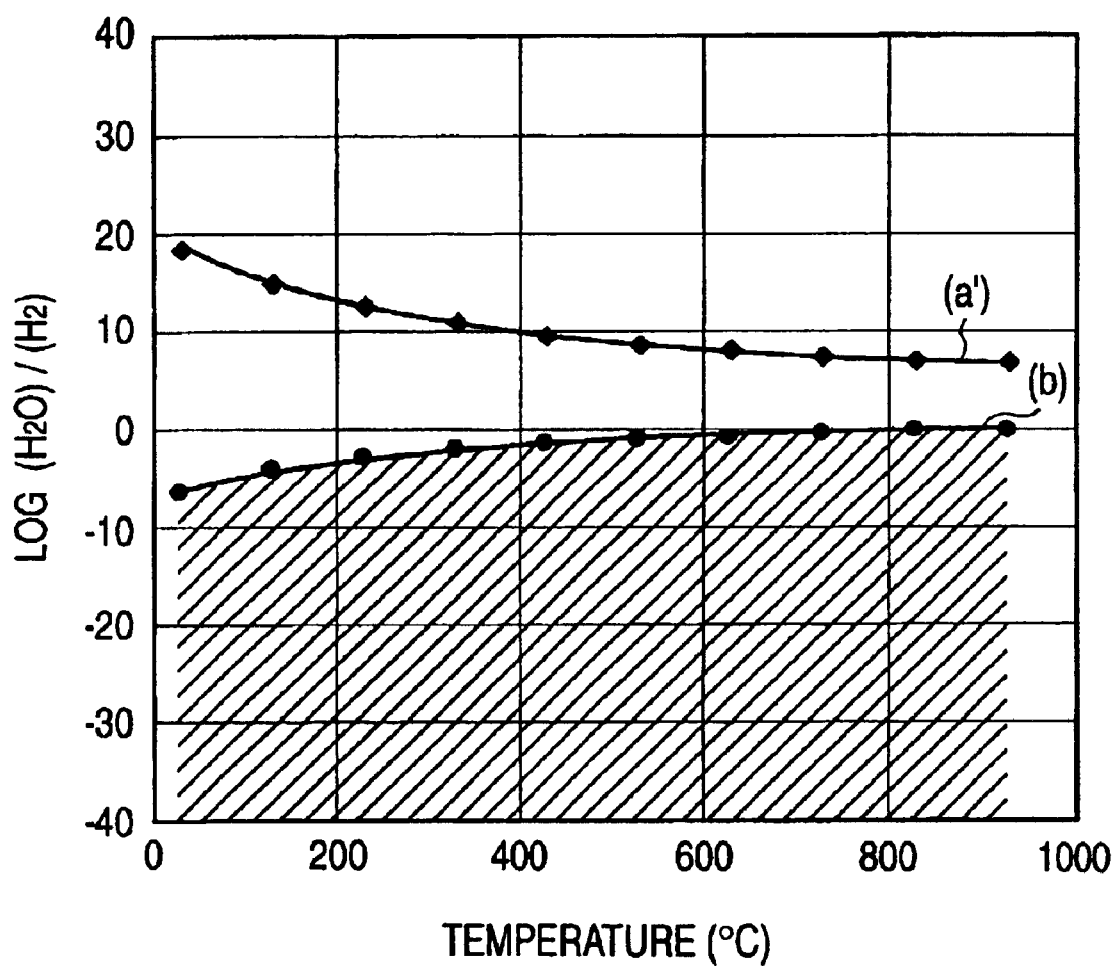
FIG. 30 is a graph illustrating a ratio of partial pressure of $H_2O$ to $H_2$ relative to temperature while forming the Cu film.

Additionally, when the reaction is generated while the ratio of partial pressure of $H_2O$ and $H_2$ is controlled to be in the shaded area below a curve (b), as shown in FIG. 30, in depositing this Cu film M1b, the oxidation of Cu or W in the barrier layer M1a comprised of tungsten nitride can be suppressed in deposition.

The curve (b) shown in FIG. 30 depicts logarithms of the equilibrium constant k in terms of reaction temperatures, in which a system 1 ($WO_2+H_2$) and a system 2 ($W+H_2O$) are in equilibrium. As described above, it is expressed by logk log$[[H_2O]$eq/$[H_2]$eq], where $[H_2O]$eq is a partial-pressure of $H_2O$ in equilibrium, $[H_2]$eq is a partial pressure of $H_2$ in equilibrium, and this equilibrium constant k is determined by the difference ($\Delta G$) of the Gibbs free energy between the system 1 and the system 2.

Thus, in a condition of being in the area above the curve (b), a balance is moved into oxidizing W. However, when the Cu film is deposited while the ratio of partial pressure of $H_2O$ to $H_2$ is controlled to be in the shaded area below the curve (b) shown in FIG. 30, the oxidation of Cu is suppressed and the oxidation of W can also be suppressed.

Accordingly, the oxidation of Cu or W in the barrier layer M1a, that is comprised of tungsten nitride, can be suppressed in deposition. Consequently, a conducting failure between the Cu film M1b and the plug P1 can be prevented. Furthermore, the oxidation of W in the barrier layer M1a is suppressed, whereby the barrier property can be prevented from dropping. Accordingly, a short circuit between interconnect lines can be avoided due to the Cu diffusion into the dielectric.

This Cu film M1b may be formed by using Cu(HFAC) (TMVS), that is a compound of Cu cations, hexafluoroacetylacetone $(CF_3COCHCOCF_3)^-$ and trimethylvinylsilane $(CH_2CHSi(CH_3)_3)$, $H_2O$, and $H_2$ as ingredients. Moreover, HFAC means $(CF_3COCHCOCF_3)^-$, and TMVS means $(CH_2\square CHSi(CH_3)_3)$.

Figure 31:
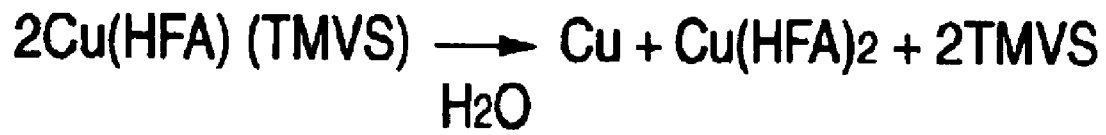
FIG. 31 is a diagram illustrating a depositing reaction of the Cu film.

An organic compound solution of Cu(HFAC)(TMVS) is vaporized to react with $H_2O$ and $H_2$ for deposition. Besides, as the organic compound solution, a tetrahydrofuran solution is employed. FIG. 31 depicts the reaction of depositing the Cu film. Also in this reaction, $H_2O$ serves like a catalyst, which $H_2O$ is added to increase the reaction rate.

Also, in this reaction, when the ratio of partial pressure of $H_2O$ to $H_2$ is controlled to be in the shaded area below the curve (a') shown in FIG. 29, the oxidation of Cu can be suppressed, as described above. Additionally, when the ratio of partial pressure of $H_2O$ to $H_2$ is controlled to be in the shaded area below the curve (b) shown in FIG. 30, the oxidation of Cu can be suppressed and the oxidation of W can also be suppressed. Consequently, a conducting failure between the Cu film M1b and the plug P1, or a short circuit between interconnect lines, can be prevented.

Figure 32:
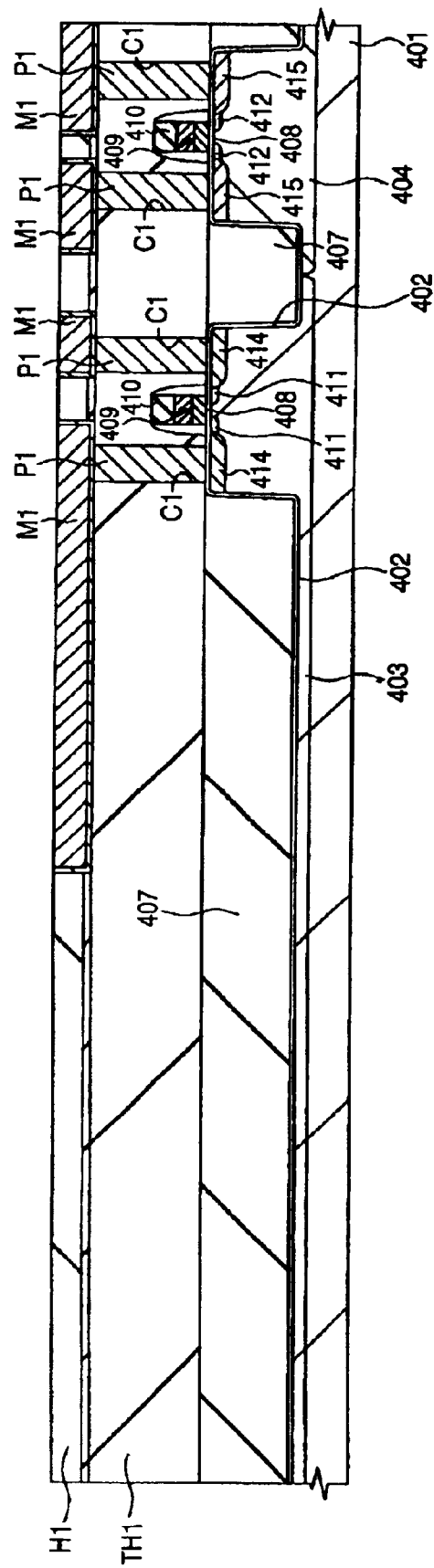
FIG. 32 is a section view of the semiconductor substrate illustrating a step in the method of manufacturing the semiconductor integrated circuit device representing the embodiment 4 of the invention.

Then, as shown in FIG. 32, the Cu film M1b and the barrier layer M1a outside the interconnecting trench HM1 are removed by CMP, whereby a first interconnect layer M1, comprised of the Cu film M1b and the barrier layer M1a, is formed.

Figure 33:
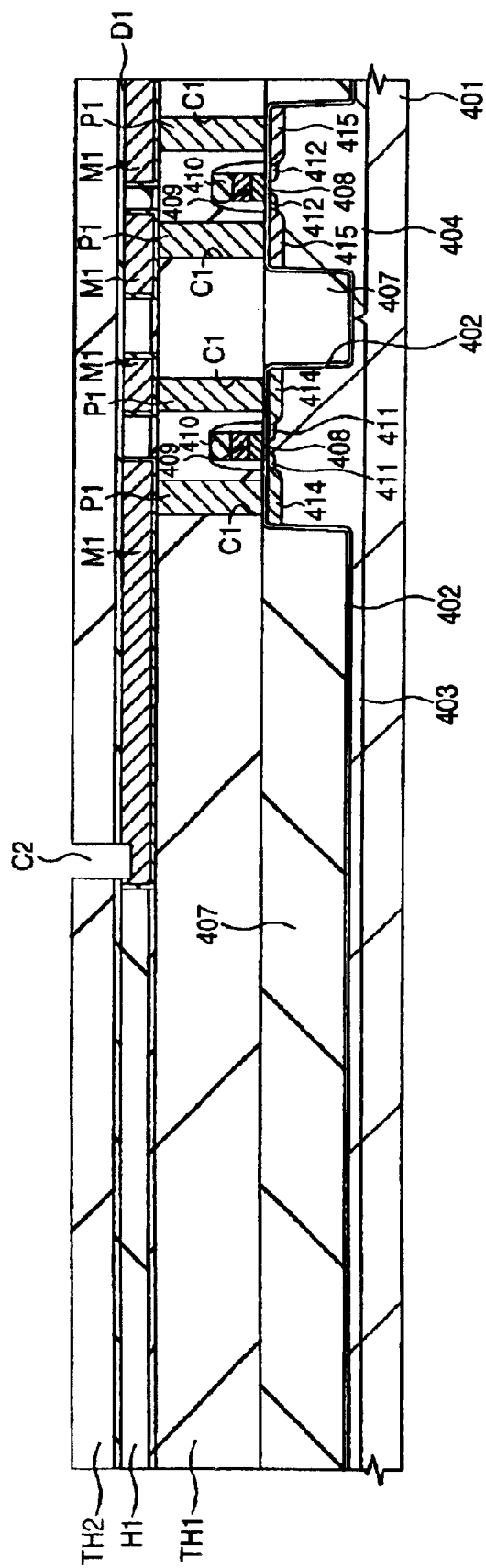
FIG. 33 is a section view of the semiconductor substrate illustrating a step in the method of manufacturing the semiconductor integrated circuit device representing the embodiment 4 of the invention.

Subsequently, as shown in FIG. 33, a silicon nitride film is deposited above the first interconnect layer M1 by CVD to form a copper diffusion preventing dielectric layer D1, and then an interlayer dielectric layer TH2 is formed. The interlayer dielectric layer TH2 is formed in a manner similar to that of the interlayer dielectric TH1.

After that, a resist film (not shown), having areas for contacts in the first interconnect layer M1 opened, is formed over the interlayer dielectric layer TH2, and it is used as a mask to anisotropically etch the interlayer dielectric layer TH2 and the copper diffusion preventing dielectric layer D1 until the surface of the first interconnect layer M1 is exposed.

Figure 34:
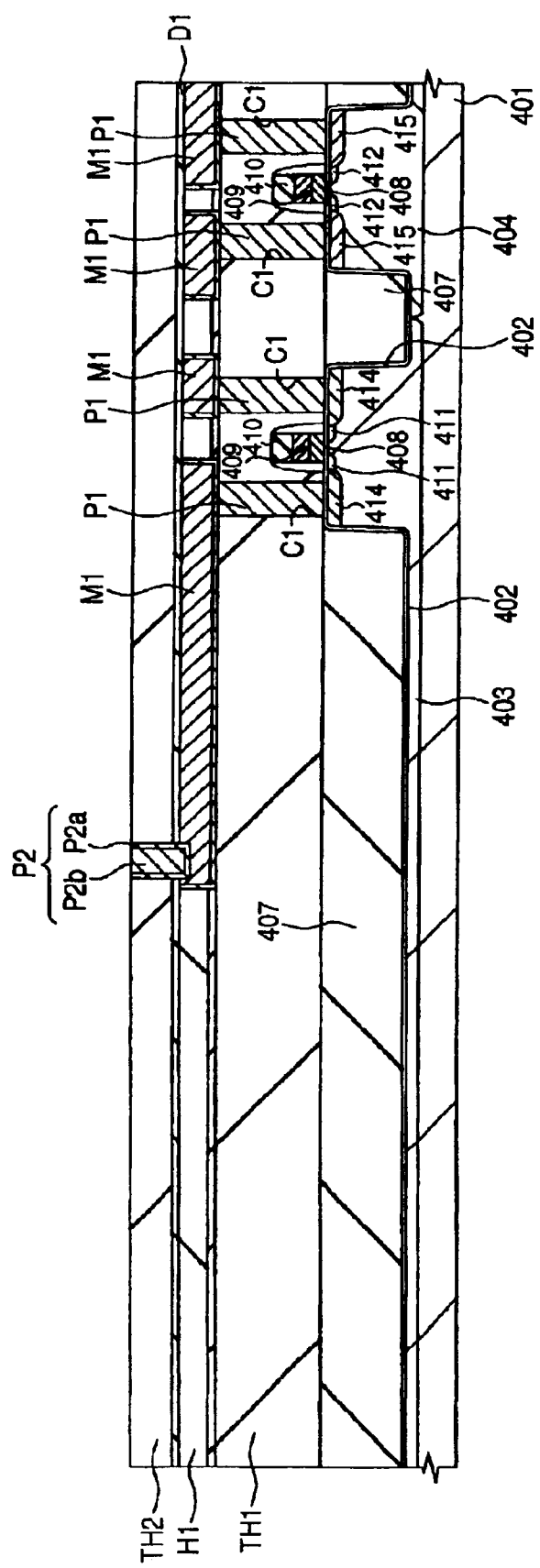
FIG. 34 is a section view of the semiconductor substrate illustrating a step in the method of manufacturing the semiconductor integrated circuit device representing the embodiment 4 of the invention.

Then, as shown in FIG. 34; a nitride of a high melting point metal, such as TiN, is deposited to a thickness of about 30 to 70 nm above the interlayer dielectric layer TH2, including the inside of the contact holes C2, to form a barrier layer P2a. Subsequently, a tungsten film P2b, having a film thickness of about 200 to 500 nm, is formed above the barrier layer P2a by CVD. Additionally, the tungsten film P2b is formed so as to fully bury the inside of the contact holes C2.

After that, the tungsten film P2b and the barrier layer P2a outside the contact holes C2 are removed by CMP, whereby a plug P2, comprised of the tungsten film P2b and the barrier layer P2a, is formed.

Figure 35:
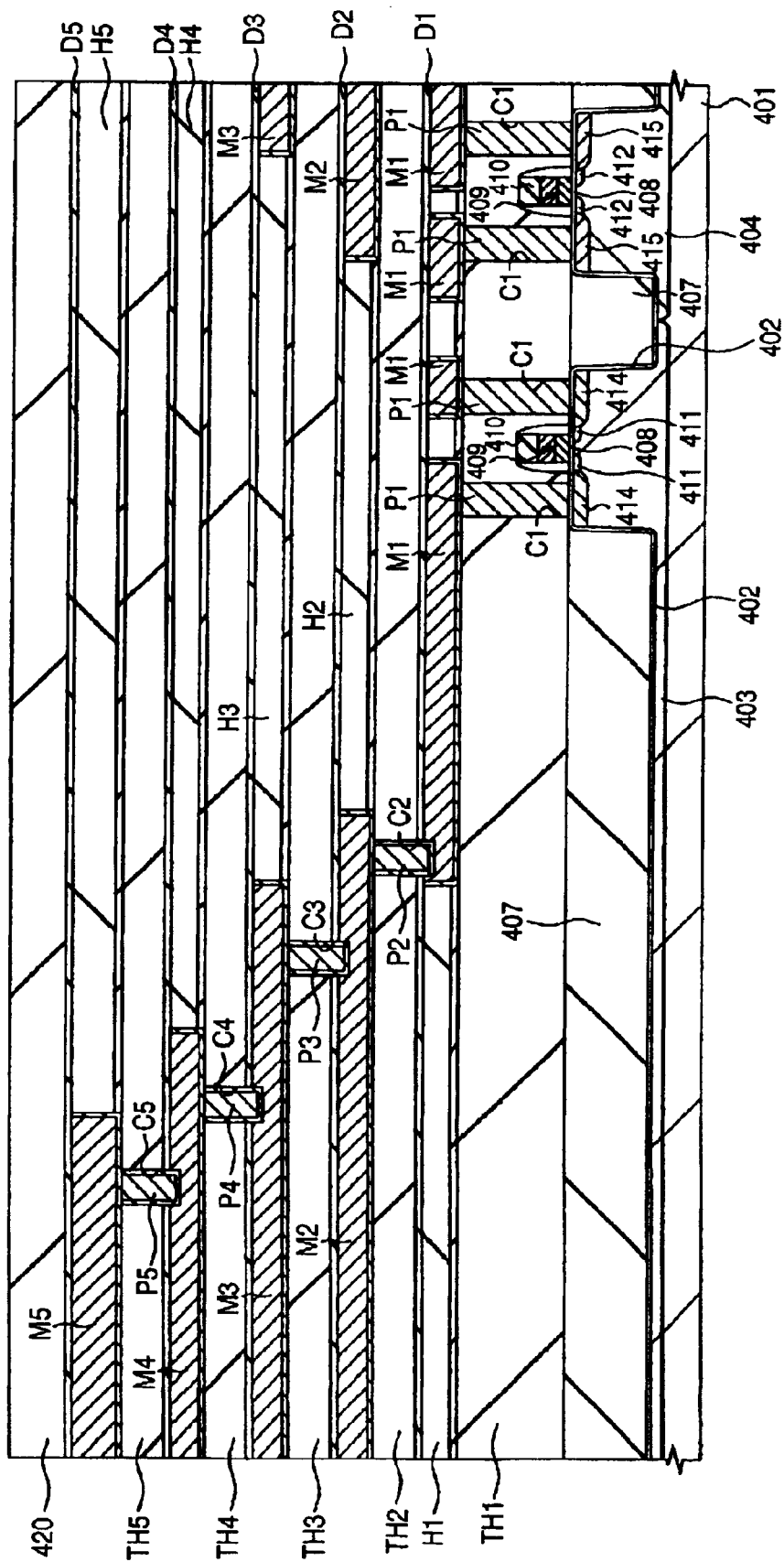
FIG. 35 is a section view of the semiconductor substrate illustrating a step in the method of manufacturing the semiconductor integrated circuit device representing the embodiment 4 of the invention.

Then, as shown in FIG. 35, a second interconnect layer M2 is formed above the plug P2 in a manner similar to that of the first interconnect layer M1. More specifically, a silicon nitride film H2a and a silicon oxide film H2b are sequentially deposited above the interlayer dielectric layer TH2 and the plug P2, and an interconnecting trench dielectric layer H2, that is comprised of these films, is etched, whereby an interconnecting trench HM2 is formed. Subsequently, a barrier layer M2a, comprised of titanium nitride, is deposited above the interconnecting trench dielectric H2, including the inside of the interconnecting trench HM2, and then a Cu film M2b is formed above the barrier layer M2a by CVD under the condition described above. After that, the Cu film M2b and the barrier layer M2a, disposed outside the interconnecting trench HM2, are removed by CMP, whereby a second interconnect layer M2, comprised of the Cu film M2b and the barrier layer M2a, is formed.

Then, a copper diffusion preventing dielectric layer D2 and an interlayer dielectric layer TH3 are formed above the second interconnect layer M2. These films are formed in a manner similar to that of the copper diffusion preventing dielectric layer D1 and the interlayer dielectric layer TH1. After that, a contact hole C3 is formed inside the copper diffusion preventing dielectric layer D2 and the interlayer dielectric layer TH3 and a plug P3 is formed inside the contact hole C3. This plug P3 is formed in a manner similar to that of the plug P2. Subsequently, an interconnecting trench dielectric H3 and an interconnecting trench HM3 are formed over the interlayer dielectric TH3 and the plug P3 in a manner similar to that of the interconnecting trench dielectric layer H1 and the interconnecting trench HM1. A third interconnect layer M3 is formed in a manner similar to that of the first interconnect layer M1.

The formation of copper diffusion preventing dielectric layers (D3, D4 and D5) and interlayer dielectric layers (TH4 and TH5) over these interconnect lines, the formation of plugs (P4 and P5) formed inside contact holes in these films and the formation of interconnect lines (M4 and M5) above the plugs are repeated, whereby a semiconductor integrated circuit device having a multilevel interconnection structure can be formed.

Subsequently, a passivation film 420, comprised of a silicon nitride film and a silicon oxide film, is formed above the fifth interconnect layer M5, and a part of the passivation film 420 is removed by etching, whereby a bonding pad part above the fifth interconnect layer M5 is exposed (not shown). Then, an underlayer bump electrode, comprised of gold, is formed over the exposed fifth interconnect layer M5 to form a bump electrode comprised of gold or solder above the underlayer bump electrode (not shown).

After that, the semiconductor integrated circuit device is packaged on a package substrate for completion, but a description of these steps will be omitted.

In addition, five layers of interconnect lines were formed in the embodiment, but interconnect lines in a number under or above five layers may be formed. Furthermore, the MISFETs Qn and Qp were formed as semiconductor devices in the embodiment, but other devices, such as bipolar transistors, may be formed, and the invention is not limited to these MISFETs. Moreover, the embodiment can widely be adapted to semiconductor integrated circuit devices having metal interconnect lines formed by CVD.

Embodiment 5

In the embodiment 1, the ratio of partial pressure of $H_2O$ to $H_2$ was controlled in depositing the Ru film, but alcohol may be used in depositing this film instead of $H_2$.

Hereafter, a method of manufacturing a DRAM according to this embodiment will be described, but it is the same as the case of the embodiment 1, other than the use of alcohol as a reducing agent instead of $H_2$ in depositing the Ru film. Thus, only the steps of depositing the Ru film will be described.

For example, a Ru film (not shown) having a film thickness of about 15 nm is formed by sputtering above the WN film 29 shown in FIG. 11, as described in connection with the embodiment 1, and then the Ru film 30, having a film thickness of about 30 nm, was forced by CVD (see FIG. 12).

Here, the Ru film 30 is formed by using $Ru(HFAC)_3$, $H_2O$ and alcohol as ingredients. As for alcohol in this case secondary alcohol or under can be used, such as methanol, ethanol or isopropyl alcohol.

First, the reaction mechanism of depositing the Ru film will be described. $Ru(HFAC)_3$ first reacts with $H_2O$ (it is decomposed by $H_2O$) to be a $Ru(OH)_3$ hydroxide. Then, this $Ru(OH)_3$ hydroxide is reduced by alcohol (R—OH) to generate Ru. At this time, the alcohol is oxidized to be aldehyde or ketone.

Figure 36:
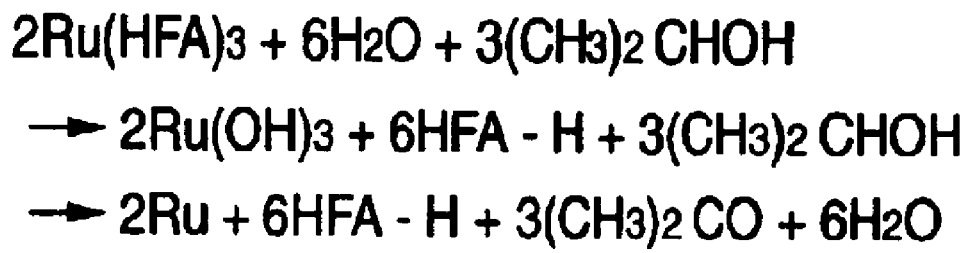
FIG. 36 is a diagram illustrating a depositing reaction of the Ru film.
Figure 37:
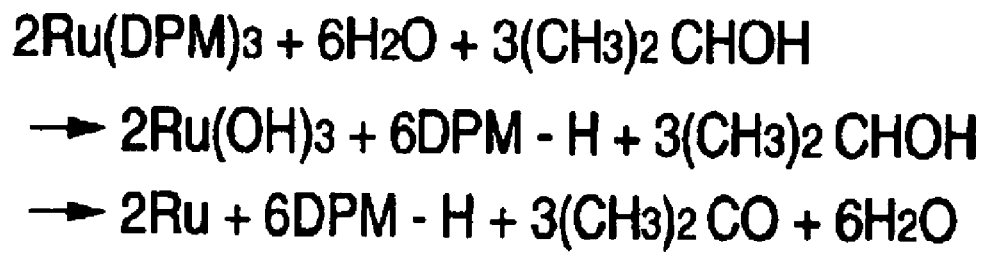
FIG. 37 is a diagram illustrating a depositing reaction of the Ru film.

FIG. 36 depicts the reaction mechanism when using isopropyl alcohol. Additionally, $Ru(DPM)_3$ may be used instead of $Ru(HFAC)_3$ (FIG. 37). Here, DPM means $((CH_3)_3CCOCHCOC(CH_3)_3)^-$. Such a reaction is an exothermic reaction of about 68 kJ under atmospheric pressure at ordinary temperature, which proceeds easily.

In this manner, according to the embodiment, $Ru(HEAC)_3$, $H_2O$ and alcohol were used in hydrolysis to form the Ru film. Thus, a Ru film having an excellent film quality can be formed as described with reference to the embodiment 1.

Additionally, alcohol is easily handled as compared with $H_2$; and, the Ru film can be formed easily.

Furthermore, the Ru film was exemplified for description in the embodiment. However, when an Ir compound, $H_2O$ and alcohol are used as ingredients to form an Ir film, the same effect can be obtained.

Moreover, when the Cu film configuring the interconnect lines described in connection with the embodiment 4 is formed by using a Cu compound, $H_2O$ and alcohol as ingredients, the same effect can be obtained. A method of manufacturing a semiconductor integrated circuit device having a Cu film in the interconnect line part is the same as the case of the embodiment 4, other than the use of alcohol as a reducing agent instead of $H_2$, and thus the description thereof will be omitted.

As described above, the invention made by the inventor has been described specifically, but it is needless to say that the invention is not limited to the embodiments, which can be modified variously without deviating the scope of the teachings of the present invention.

A brief description of the effects obtained by representative aspects and features of the invention disclosed in this application is as follows.

The film quality of a metal film formed by CVD can be enhanced, such as the Ru film configuring the lower electrode of an information storage capacitor or a Cu film configuring interconnect lines.

Additionally, the film quality of a metal oxide film formed by CVD can be enhanced, such as the tantalum oxide film configuring the capacitive dielectric of an information storage capacitor.

Furthermore, the oxidation of a metal film or metal oxide film under the metal film or metal oxide film formed by CVD can be suppressed, and conducting failures can be reduced.

Consequently, the characteristics of the semiconductor integrated circuit devices can be improved.

What is claimed is:

1. A method of manufacturing a semiconductor integrated circuit device comprising the steps of:
    (a) forming memory cell selecting MISFETs over a main surface of a semiconductor substrate; and
    (b) forming a Ru (ruthenium) film by chemical vapor deposition using a compound of Ru, $H_2O$ and a reducing agent, wherein the Ru film comprises a lower electrode of a capacitor electrically connected to source/drain regions of the memory cell selecting MISFETs.

2. The method of manufacturing the semiconductor integrated circuit device according to claim 1, wherein the reducing agent is $H_2$ or alcohol.

3. The method of manufacturing the semiconductor integrated circuit device according to claim 1, wherein the compound of Ru is an acetylacetone derivative compound of Ru.

4. The method of manufacturing the semiconductor integrated circuit device according to claim 1 further comprising the steps of:

(c) forming a capacitor dielectric over the Ru film; and (d) forming an upper electrode over the capacitor dielectric.

5. A method of manufacturing a semiconductor integrated circuit device comprising the steps of:

(a) forming memory cell selecting MISFETs over a main surface of a semiconductor substrate; and (b) forming a Ru (ruthenium) film by chemical vapor deposition using a compound of Ru, $H_2O$ and $H_2$ at a predetermined temperature, wherein the Ru film comprises a lower electrode of a capacitor electrically connected to source/drain regions of the memory cell selecting MISFETs, wherein the Ru film is formed under a condition that a ratio of partial pressure of the $H_2O$ to the $H_2$ ($[H_2O]/[H_2]$) at the temperature becomes smaller than a ratio of partial pressure of $H_2O$ to $H_2$ ($[H_2O]eq/[H_2]eq$) when a system 1 ($RuO_2+H_2$) and a system 2 ($Ru+H_2O$) are in equilibrium at the temperature.

6. The method of manufacturing the semiconductor integrated circuit device according to claim 5, wherein the predetermined temperature is from 100 to 500° C.

7. A method of manufacturing a semiconductor integrated circuit device comprising the steps of:

(a) forming memory cell selecting MISFETs over a main surface of a semiconductor substrate;

(b) forming a plug electrically connected to source/drain regions of the memory cell selecting MISFETS;

(c) forming a silicon oxide film over the plug;

(d) forming a hole in the silicon oxide film, the hole reaching a surface of the plug;

(e) forming a metal layer or metal nitride layer having conductivity over sidewalls and a bottom surface of the hole; and (f) forming a Ru film over the metal layer or metal nitride layer by chemical vapor deposition using a compound of Ru, $H_2O$ and a reducing agent, wherein the Ru film comprises a lower electrode of a capacitor.

8. The method of manufacturing the semiconductor integrated circuit device according to claim 7, wherein the reducing agent is $H_2$ or alcohol.

9. The method of manufacturing the semiconductor integrated circuit device according to claim 7 further comprising the steps of:

(g) forming a capacitor dielectric over the Ru film; and (h) forming an upper electrode over the capacitor dielectric.

10. The method of manufacturing the semiconductor integrated circuit device according to claim 7, wherein the metal layer or metal nitride layer is a tungsten layer or tungsten nitride layer.

11. The method of manufacturing the semiconductor integrated circuit device according to claim 7, wherein the metal nitride layer is a tantalum nitride layer.

12. The method of manufacturing the semiconductor integrated circuit device according to claim 7, wherein the compound of Ru is an acetylacetone derivative compound of Ru.

13. A method of manufacturing a semiconductor integrated circuit device comprising the steps of:

(a) forming memory cell selecting MISFETs over a main surface of a semiconductor substrate;

(b) forming a plug electrically connected to source/drain regions of the memory cell selecting MISFETs;

(c) forming a silicon oxide film over the plug;

(d) forming a hole in the silicon oxide film, the hole reaching a surface of the plug;

(e) forming a metal layer or metal nitride layer having conductivity over sidewalls and a bottom surface of the hole; and (f) forming a Ru film over the metal layer or metal nitride layer by chemical vapor deposition using a compound of Ru, $H_2O$ and a reducing agent at a predetermined temperature, wherein the Ru film comprises a lower electrode of a capacitor, wherein the Ru film is formed under a condition that a ratio of partial pressure of the $H_2O$ to the $H_2$ ($[H_2O]/[H_2]$) becomes smaller than a ratio of partial pressure of $H_2O$ to $H_2$ ($[H_2O]eq/[H_2]eq$) when a system 1 (an oxide of metal forming the metal layer or metal nitride layer+$H_2$) and a system 2 (a metal forming the metal layer or metal nitride layer+$H_2O$) are in equilibrium at the temperature.

* * * * *